US012772691B2

(12) United States Patent
Park et al.

(10) Patent No.: US 12,772,691 B2
(45) Date of Patent: Oct. 20, 2026

(54) DISPLAY DEVICE AND METHOD OF MANUFACTURING DISPLAY DEVICE

(71) Applicant: Samsung Display Co., Ltd., Yongin-si (KR)

(72) Inventors: Keunwoo Park, Yongin-si (KR); Danbi Yang, Yongin-si (KR); Kangseob Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 341 days.

(21) Appl. No.: 18/648,263

(22) Filed: Apr. 26, 2024

(65) Prior Publication Data

US 2025/0031544 A1 Jan. 23, 2025

(30) Foreign Application Priority Data

Jul. 17, 2023 (KR) ........................ 10-2023-0092721

(51) Int. Cl.
*H10K 59/38* (2023.01)
*H10K 59/12* (2023.01)

(52) U.S. Cl.
CPC ......... *H10K 59/38* (2023.02); *H10K 59/1201* (2023.02)

(58) Field of Classification Search
CPC ........................... H10K 59/38; H10K 59/1201
USPC ............................................................ 257/91
See application file for complete search history.

(56) References Cited

U.S. PATENT DOCUMENTS 7,750,984 B2 7/2010 Ha et al.
10,274,775 B2 * 4/2019 Im ..................... G02F 1/133512
10,892,309 B2 1/2021 Kim et al.
11,355,558 B2 6/2022 Park et al.
11,500,240 B2 * 11/2022 Kim .................. G02F 1/133512
11,709,396 B2 7/2023 Kim et al.
12,262,602 B2 * 3/2025 Kim ..................... H10K 59/131
2021/0384467 A1 12/2021 Park et al.
2022/0109123 A1 4/2022 Ahn et al.
2022/0231087 A1 7/2022 Jeon et al.
(Continued)

FOREIGN PATENT DOCUMENTS

KR 10-2020-0113077 A 10/2020
KR 10-2225848 B1 3/2021
(Continued)

*Primary Examiner* — Tu-Tu V Ho
(74) *Attorney, Agent, or Firm* — Womble Bond Dickinson (US) LLP

(57) ABSTRACT

The display device includes a base layer including a display area, and a non-display area adjacent to the display area, a display element layer including first to third light-emitting elements above the base layer and overlapping the display area, a light control layer above the display element layer, and including first to third light controllers respectively overlapping the first to third light-emitting elements, a color filter layer above the light control layer and overlapping the display area, a step compensation layer above the base layer, overlapping the non-display area, including a same material as that of the first light controller, and including a first part having a first thickness and a second part having a second thickness that is less than the first thickness, and a sealing member between the base layer and the step compensation layer, overlapping the non-display area, and overlapping the second part.

25 Claims, 16 Drawing Sheets

(56) References Cited

U.S. PATENT DOCUMENTS

| | | | |
|---|---|---|---|
| 2022/0285447 | A1 | 9/2022 | Park et al. |
| 2022/0359798 | A1 | 11/2022 | Kim et al. |

FOREIGN PATENT DOCUMENTS

| | | | |
|---|---|---|---|
| KR | 10-2021-0152102 | A | 12/2021 |
| KR | 10-2021-0153170 | A | 12/2021 |
| KR | 10-2022-0046028 | A | 4/2022 |
| KR | 10-2022-0105253 | A | 7/2022 |
| KR | 10-2022-0152463 | A | 11/2022 |

* cited by examiner

DISPLAY DEVICE AND METHOD OF MANUFACTURING DISPLAY DEVICE

CROSS-REFERENCE TO RELATED APPLICATIONS

This application claims priority to, and the benefit of, Korean Patent Application No. 10-2023-0092721, filed on Jul. 17, 2023, in the Korean Intellectual Property Office, the entire disclosure of which is incorporated by reference.

BACKGROUND

1. Field

Embodiments of the present disclosure described herein relate to a display device having improved visibility, and a method of manufacturing the display device.

2. Description of the Related Art

When one component of a display device has light transparency, an internal component of the display device may be visually recognized from the outside.

SUMMARY

Embodiments of the present disclosure provide a display device that solves a problem wherein a sealing member is visually recognized from the outside.

Embodiments of the present disclosure also provide a method of manufacturing the display device that solves the problem that the sealing member is visually recognized from the outside.

According to one or more embodiments, a display device includes a base layer including a display area, and a non-display area adjacent to the display area, a display element layer including a first light-emitting element, a second light-emitting element, and a third light-emitting element above the base layer and overlapping the display area, a light control layer above the display element layer, and including a first light controller, a second light controller, and a third light controller respectively overlapping the first light-emitting element, the second light-emitting element, and the third light-emitting element, a color filter layer above the light control layer and overlapping the display area, a step compensation layer above the base layer, overlapping the non-display area, including a same material as that of the first light controller, and including a first part having a first thickness and a second part having a second thickness that is less than the first thickness, and a sealing member between the base layer and the step compensation layer, overlapping the non-display area, and overlapping the second part.

The second part may contact the sealing member.

A width of the second part in one direction may be greater than or equal to a width of the sealing member in the one direction.

The first light controller and the step compensation layer may include an organic material in which titanium dioxide is dispersed.

The display device may further include a bank above the display element layer, and defining a first opening, a second opening, and a third opening, wherein the first light controller, the second light controller, and the third light controller respectively correspond to the first opening, the second opening, and the third opening.

The display device may further include a column spacer between the display element layer and the bank.

The column spacer may include a same material as the first light controller.

The step compensation layer and the sealing member may have a light transmittance.

The first light-emitting element, the second light-emitting element, and the third light-emitting element may respectively provide a source light beam, wherein the second light controller includes a first quantum dot configured to convert at least a portion of the source light beam from the first light-emitting element into a light beam having a first color, and wherein the third light controller includes a second quantum dot configured to convert at least a portion of the source light beam from the second light-emitting element into a light beam having a second color that is different from the first color.

The display device may further include a base substrate above the step compensation layer and the color filter layer.

The display device may further include a low refractive layer, partially between the color filter layer and the light control layer, and partially between the base substrate and the step compensation layer while contacting a lower surface of the base substrate.

The display device may further include a barrier layer partially under the light control layer to cover an underside of the light control layer, and partially under the step compensation layer to cover an underside of the step compensation layer and to contact the sealing member.

The color filter layer may be spaced from the non-display area in plan view.

The step compensation layer may further include a third part spaced apart from the first part with the second part interposed therebetween, and having a third thickness that is greater than the second thickness, wherein the first part, the second part, and the third part collectively define a groove.

According to one or more embodiments, a display device includes a base layer including a display area, and a non-display area adjacent to the display area, a display element layer above the base layer, and including a first light-emitting element, a second light-emitting element, and a third light-emitting element that overlap the display area, a light control layer above the display element layer, and including a first light controller, a second light controller, and a third light controller that respectively overlap the first light-emitting element, the second light-emitting element, and the third light-emitting element, a color filter layer overlapping the display area above the light control layer, a step compensation layer overlapping the non-display area above the base layer, and a sealing member overlapping the non-display area between the base layer and the step compensation layer, wherein a second light transmittance of a second area overlapping the sealing member is less than a first light transmittance of a first area spaced apart from the sealing member in plan view.

A difference between the second light transmittance and the first light transmittance may be about 10% or less.

A light transmittance in the display area may be about 40% or more.

The step compensation layer may include about 2 wt % to about 7 wt % of titanium dioxide based on a total weight of the step compensation layer, wherein the step compensation layer has a thickness in a range of about 3 μm to about 12 μm.

The display device may further include a dummy pattern between the color filter layer and the display element layer.

According to one or more embodiments, a method of manufacturing a display device providing a preliminary light control member including a base substrate including a display area, and a non-display area adjacent to the display area, and a color filter layer overlapping the display area above the base substrate, forming a coating layer including an organic material, in which scatterers are dispersed, above the preliminary light control member, and etching a portion of the coating layer to form a step compensation layer including a first part having a first thickness and a second part having a second thickness that is less than the first thickness, and overlapping the non-display area.

The method may further include arranging a mask including a semi-transmissive area in a portion corresponding to the non-display area above the preliminary light control member.

In the preliminary light control member may further include a first light controller, a second light controller, and a third light controller overlapping the display area and arranged on the color filter layer.

The method may further include forming a first light controller overlapping the display area by etching another portion of the coating layer concurrently or substantially simultaneously with the etching of the portion of the coating layer to form the step compensation layer.

The preliminary light control member may further include a bank above the color filter layer and defining a first opening, a second opening, and a third opening respectively corresponding to a first light controller, a second light controller, and a third light controller, wherein the method further includes forming a column spacer on the bank and overlapping the display area by etching another portion of the coating layer concurrently or substantially simultaneously with the etching of the portion of the coating layer to form the step compensation layer, The method may further include arranging the preliminary light control member, on which the step compensation layer is formed, on a display panel including a base layer and a display element layer above the base layer, and forming a sealing member overlapping the second part between the display panel and the step compensation layer.

BRIEF DESCRIPTION OF THE DRAWINGS

The above and other aspects of the present disclosure will become apparent by describing in detail embodiments thereof with reference to the accompanying drawings.

DETAILED DESCRIPTION

Figure 1:
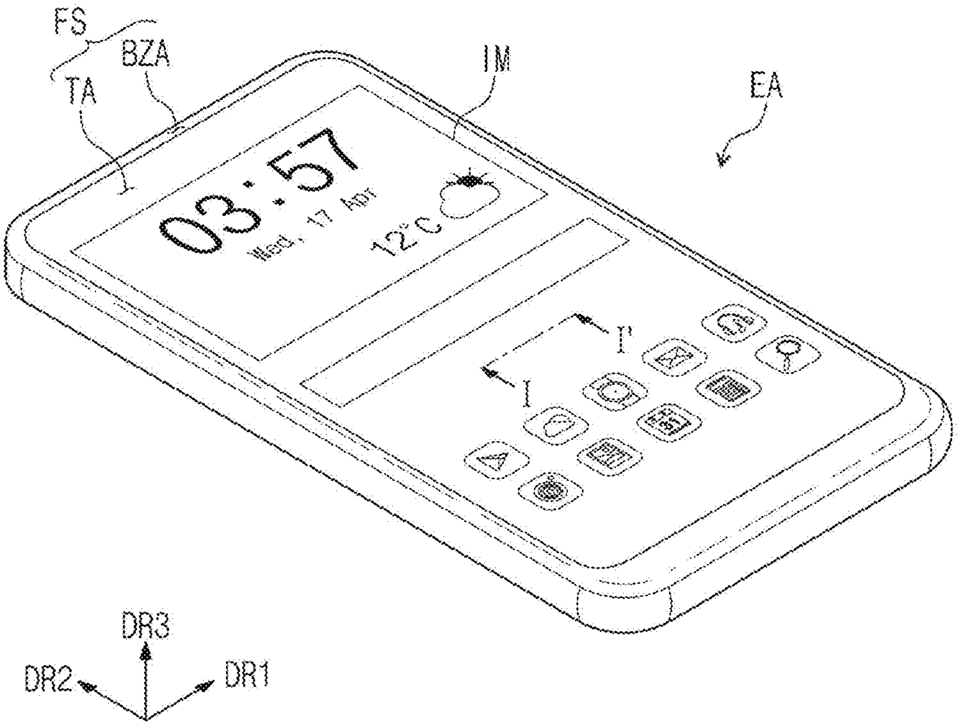
FIG. 1 is a perspective view of an electronic device according to one or more embodiments.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure. The present disclosure covers all modifications, equivalents, and replacements within the idea and technical scope of the present disclosure. Further, each of the features of the various embodiments of the present disclosure may be combined with each other, in part or in whole, and technically various interlocking and driving are possible. Each embodiment may be implemented independently of each other or may be implemented together in an association.

In the drawings, the relative sizes of elements, layers, and regions may be exaggerated for clarity and/or descriptive purposes. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as “beneath,” “below,” “lower,” “lower side,” “under,” “above,” “upper,” “upper side,” and the like, may be used herein for ease of explanation to describe one element or feature’s relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as “below,” “beneath,” “or “under” other elements or features would then be oriented “above” the other elements or features. Thus, the example terms “below” and “under” can encompass both an orientation of above and below. The device may be otherwise oriented (e.g., rotated 90 degrees or at other orientations) and the spatially relative descriptors used herein should be interpreted accordingly. Similarly, when a first part is described as being arranged “on” a second part, this indicates that the first part is arranged at an upper side or a lower side of the second part without the limitation to the upper side thereof on the basis of the gravity direction.

Further, the phrase “in a plan view” means when an object portion is viewed from above, and the phrase “in a schematic cross-sectional view” means when a schematic cross-section taken by vertically cutting an object portion is viewed from the side. The terms “overlap” or “overlapped” mean that a first object may be above or below or to a side of a second object, and vice versa. Additionally, the term “overlap” may include stack, face or facing, extending over, covering, or partly covering or any other suitable term as would be appreciated and understood by those of ordinary skill in the art. The expression “not overlap” may include meaning, such as “apart from” or “set aside from” or “offset from” and any other suitable equivalents as would be appreciated and understood by those of ordinary skill in the art. The terms “face” and “facing” may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being “formed on,” “on,” “connected to,” or “(operatively or communicatively) coupled to” another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being “electrically connected” or “electrically coupled” to another layer, region, or component, it can be directly electrically connected or coupled to the other layer, region, and/or component or one or more intervening layers, regions, or components may be present. The one or more intervening components may include a switch, a resistor, a capacitor, and/or the like. In describing embodiments, an expression of connection indicates electrical connection unless explicitly described to be direct connection, and “directly connected/directly coupled,” or “directly on,” refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed “under” another portion, this includes not only a case where the portion is “directly beneath” another portion but also a case where there is further another portion between the portion and another portion. Meanwhile, other expressions describing relationships between components, such as “between,” “immediately between” or “adjacent to” and “directly adjacent to,” may be construed similarly. It will be understood that when an element or layer is referred to as being “between” two elements or layers, it can be the only element or layer between the two elements or layers, or one or more intervening elements or layers may also be present.

For the purposes of this disclosure, expressions, such as “at least one of,” or “any one of,” or “one or more of” when preceding a list of elements, modify the entire list of elements and do not modify the individual elements of the list. For example, “at least one of X, Y, and Z,” “at least one of X, Y, or Z,” “at least one selected from the group consisting of X, Y, and Z,” and “at least one selected from the group consisting of X, Y, or Z” may be construed as X only, Y only, Z only, any combination of two or more of X, Y, and Z, such as, for instance, XYZ, XYY, YZ, and ZZ, or any variation thereof. Similarly, the expressions “at least one of A and B” and “at least one of A or B” may include A, B, or A and B. As used herein, “or” generally means “and/or,” and the term “and/or” includes any and all combinations of one or more of the associated listed items. For example, the expression “A and/or B” may include A, B, or A and B. Similarly, expressions, such as “at least one of,” “a plurality of,” “one of,” and other prepositional phrases, when preceding a list of elements, modify the entire list of elements and do not modify the individual elements of the list.

It will be understood that, although the terms “first,” “second,” “third,” etc., may be used herein to describe various elements, components, regions, layers and/or sections, these elements, components, regions, layers and/or sections should not be limited by these terms. These terms do not correspond to a particular order, position, or superiority, and are used only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a “first” element may not require or imply the presence of a second element or other elements. The terms “first,” “second,” etc. may also be used herein to differentiate different categories or sets of elements. For conciseness, the terms “first,” “second,” etc. may represent “first-category (or first-set),” “second-category (or second-set),” etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
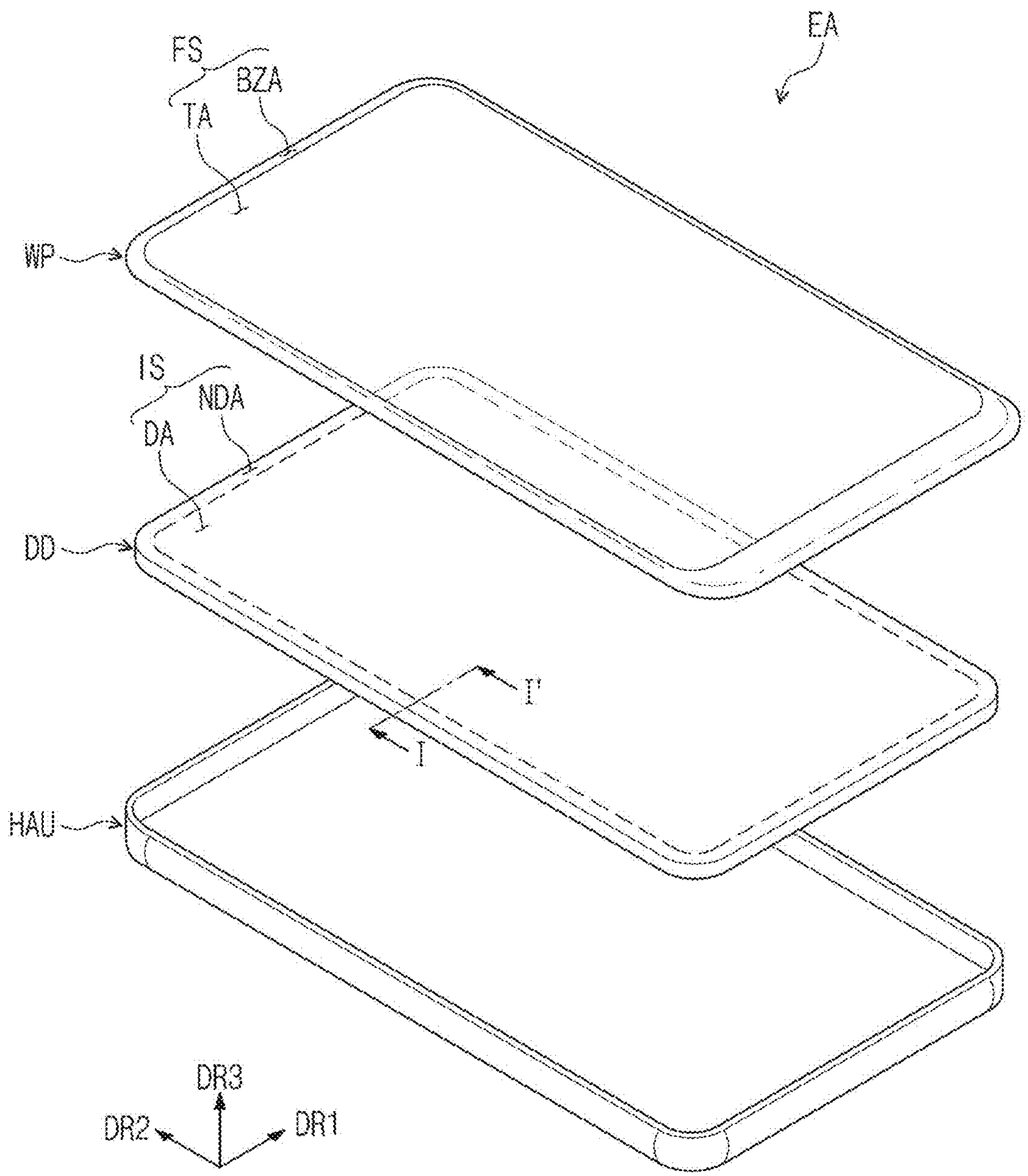
FIG. 2 is an exploded perspective view of the electronic device according to the embodiment.

FIG. 1 is a perspective view of an electronic device according to one or more embodiments. FIG. 2 is an exploded perspective view of the electronic device according to one or more embodiments.

In one or more embodiments, an electronic device EA may be a large display device, such as a television, a monitor, or an external billboard. Further, the electronic device EA may be a small or medium-sized electronic device, such as a personal computer (PC), a laptop, a personal digital terminal, a vehicle navigation unit, a game console, a smart phone, a tablet PC, and a camera. Further, these devices are merely presented as one or more embodiments and may be employed as other display devices as long as the display devices do not depart from the concept of the present disclosure. In one or more embodiments, the electronic device EA is illustrated as a smart phone.

In one or more embodiments, the electronic device EA may include a foldable display device including a folding area and a non-folding area, or a bending display device including at least one bending part.

A front surface of the electronic device EA may correspond to a front surface of a display device DD and a front surface of a window WP. Accordingly, the front surface of the electronic device EA, the front surface of the display device DD, and the front surface of the window WP may use the same reference numeral FS.

Referring to FIG. 1, the electronic device EA may include the window WP, the display device DD, and a housing HAU.

The window WP may include an optically transparent insulating material. The window WP may include a transmissive area TA and a bezel area BZA.

The transmissive area TA may be an optically transparent area. In FIGS. 1 and 2, the transmissive area TA is illustrated as a quadrangular shape having rounded corners. However, this is only an example, and the transmissive area TA may have various shapes in other embodiments.

The bezel area BZA may be an area having a relatively low light transmittance as compared to the transmissive area TA. The bezel area BZA may have a color (e.g., predetermined color). The bezel area BZA may be adjacent to the transmissive area TA, and may surround the transmissive area TA (e.g., in plan view). The bezel area BZA may define a shape of the transmissive area TA. However, one or more embodiments is not limited to the illustration, the bezel area BZA may be located adjacent to only one side of the transmissive area TA, and a portion thereof may be omitted.

The display device DD may be a component that substantially generates an image IM. The display device DD may be located under the window WP. In the present specification, the term "under" may mean a direction opposite to a direction in which the display device DD provides an image.

The display device DD may display the image IM through a display surface IS, and a user may visually recognize an image provided through the transmissive area TA corresponding to the front surface FS of the electronic device EA. The image IM may include a still image as well as a dynamic image. FIG. 1 illustrates a case in which the front surface FS is parallel to a plane defined by a first direction DR1, and a second direction DR2 intersecting the first direction DR1. However, this is only an example, and the front surface FS may have a curved shape in one or more other embodiments.

A third direction DR3 indicates a normal direction of the front surface FS of the electronic device EA, that is, a direction in which the image IM is displayed among a thickness direction of the electronic device EA. Front surfaces (or upper surface) and rear surfaces (or lower surfaces) of members may be distinguished by the third direction DR3.

The display device DD includes a display area DA and a non-display area NDA. The display area DA may be an area that is activated according to an electrical signal. The non-display area NDA may be an area covered by the bezel area BZA. The non-display area NDA is adjacent to the display area DA. The non-display area NDA may surround the display area DA (e.g., in plan view).

The housing HAU may be located under the display device DD. The housing HAU may accommodate the display device DD. The housing HAU may be located to cover the display device DD so that an upper surface of the display device DD, which is the display surface IS, is exposed. The housing HAU may cover a side surface and a bottom surface of the display device DD, and may expose the entire upper surface of the display device DD. However, the present disclosure is not limited thereto, and the housing HAU may cover not only the side surface and the bottom surface of the display device DD, but also may cover a portion of the upper surface of the display device DD.

The housing HAU may protect the display device DD from an external impact or intrusion of foreign substances. The housing HAU may be made of a material, such as a plastic or a metal. However, this is only an example, and the material is not limited thereto as long as the material may protect the display device DD from an external impact or intrusion of foreign substances.

Figure 3:
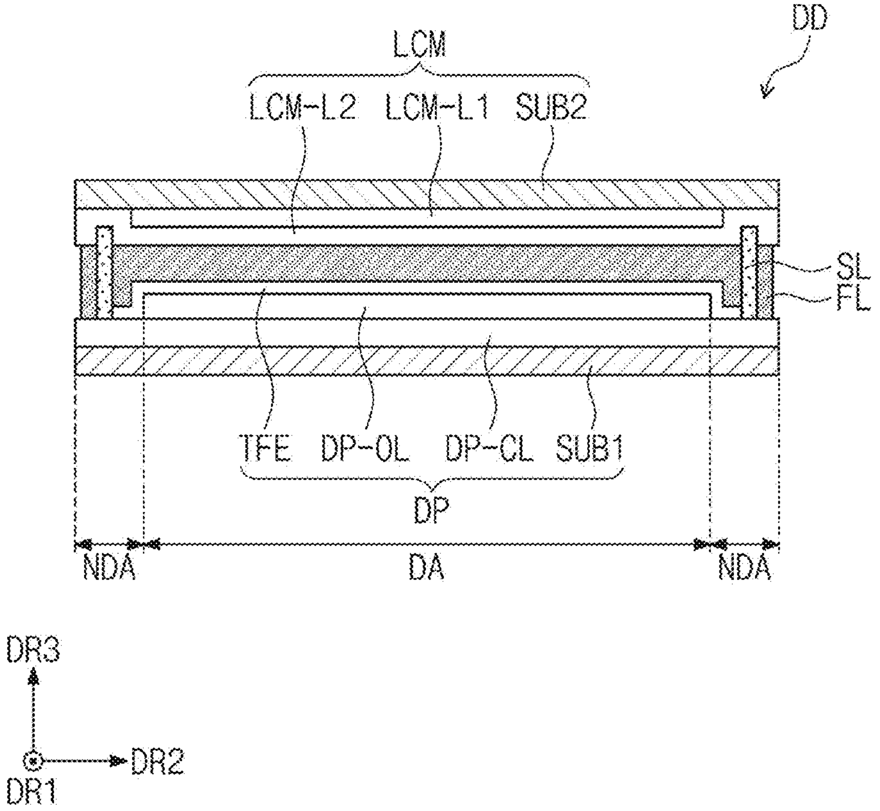
FIG. 3 is a cross-sectional view of a display device according to one or more embodiments.

FIG. 3 is a cross-sectional view of the display device according to one or more embodiments.

Referring to FIG. 3, the display device DD according to one or more embodiments of the present disclosure may include a display panel DP, a light control member LCM, a sealing member SL located between the display panel DP and the light control member LCM, and a filling member FL. The display device DD according to one or more embodiments may be manufactured by coupling the display panel DP and the light control member LCM through a bonding process.

The display panel DP may include a base layer SUB1, a circuit layer DP-CL, a display element layer DP-OL, and an encapsulation layer TFE.

The base layer SUB1 may include the display area DA and the non-display area NDA, and may provide a base surface on which components of the display panel DP are stacked. The base layer SUB1 may include an upper surface and a lower surface parallel to the first direction DR1 and to the second direction DR2. The circuit layer DP-CL, the display element layer DP-OL, and the encapsulation layer TFE may be sequentially stacked above the upper surface of the base layer SUB1 in the third direction DR3.

The display element layer DP-OL may include light-emitting elements arranged in the display area DA. The circuit layer DP-CL may be located between the display element layer DP-OL and the base layer SUB1, and may include driving elements, signal lines, and pads connected to the light-emitting elements. The light-emitting elements of the display element layer DP-OL may provide source light beams toward the light control member LCM within the display area DA.

The encapsulation layer TFE may be located on the display element layer DP-OL to seal the light-emitting elements. The encapsulation layer TFE may include a plurality of thin films. The thin films of the encapsulation layer TFE may be arranged to improve optical efficiency of the light-emitting elements, or to protect the light-emitting elements.

In one or more embodiments of the present disclosure, the light control member LCM may include a first light control member LCM-L1, a second light control member LCM-L2, and a base substrate SUB2. The first light control member LCM-L1 may include a low refractive layer LR (see FIG. 4A) and a color filter layer CFL (see FIG. 4A). The second light control member LCM-L2 may include a first barrier layer BFL1 (see FIG. 4A), a bank BK (see FIG. 4A), a step compensation layer SCL (see FIG. 4A), a light control layer CCL (see FIG. 4A), and a second barrier layer BFL2 (see FIG. 4A).

The base substrate SUB2 may provide a base surface on which the components of the light control member LCM are stacked. The base substrate SUB2 may include a front surface and a rear surface parallel to the first direction DR1 and to the second direction DR2. The rear surface of the base substrate SUB2 may face the upper surface of the base layer SUB1.

Figure 4A:
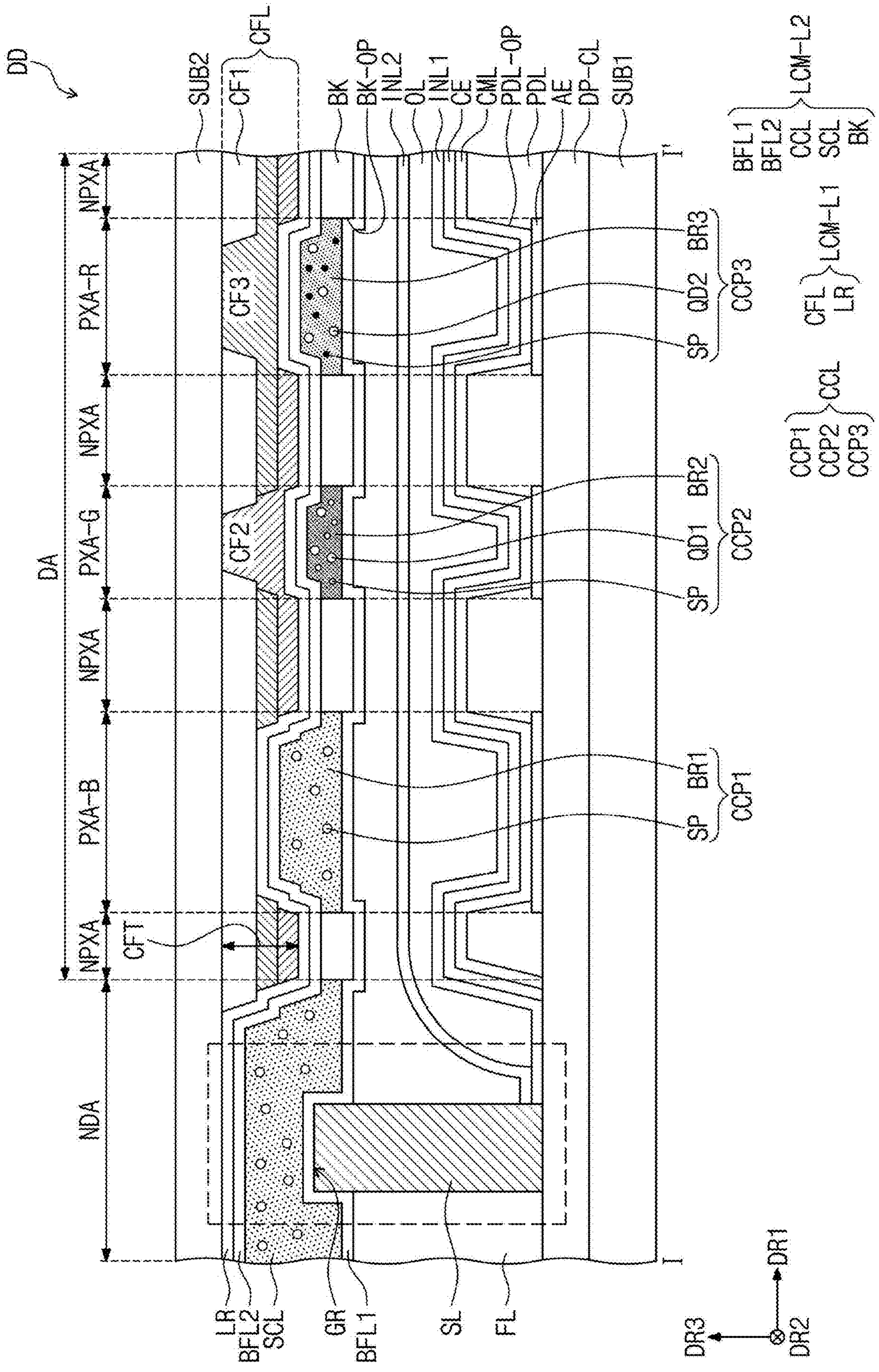
FIG. 4A is a cross-sectional view of the display device along the line I-I' of FIG. 2.

The sealing member SL may be formed to overlap the non-display area NDA between the display panel DP and the light control member LCM. Referring to FIGS. 2 and 4A, the sealing member SL may be aligned with an edge of the display device DD on a plane/in plan view, but the present disclosure is not limited thereto. The sealing member SL serves to fix the display panel DP and the light control member LCM so that the display panel DP and the light control member LCM are spaced a distance (e.g., predetermined distance) from each other, and to reduce or prevent intrusion of external oxygen or moisture.

The sealing member SL includes an organic material to secure viscosity and impact resistance that allow the display panel DP and the light control member LCM to be bonded to each other. The sealing member SL may include a binder resin and inorganic fillers mixed with the binder resin. The sealing member SL may further include other additives. The additives may include amine-based curing agents and photoinitiators. The additives may further include silane-based additives and acrylic-based additives. The sealing member SL may also include an inorganic material, such as frit. Accordingly, the sealing member SL may have light transmittance, but may have a relatively low light transmittance as compared to other components of the display device DD arranged in the non-display area NDA.

The filling member FL may be located between the display panel DP and the light control member LCM, and may fill an empty space between the display panel DP and the light control member LCM that overlap the display area DA. In one or more embodiments, the filling member FL may be located between the encapsulation layer TFE and the light control member LCM. The filling member FL may include a silicone, an epoxy, or an acrylic-based thermosetting material. However, the materials of the filling member FL are not limited to the above examples.

The display panel DP and the light control member LCM may be formed through separate processes, and the display device DD may be manufactured by bonding the display panel DP and the light control member LCM using the sealing member SL. A method of manufacturing the display device DD will be described below in detail with reference to FIGS. 5A and 5G.

Figure 4B:
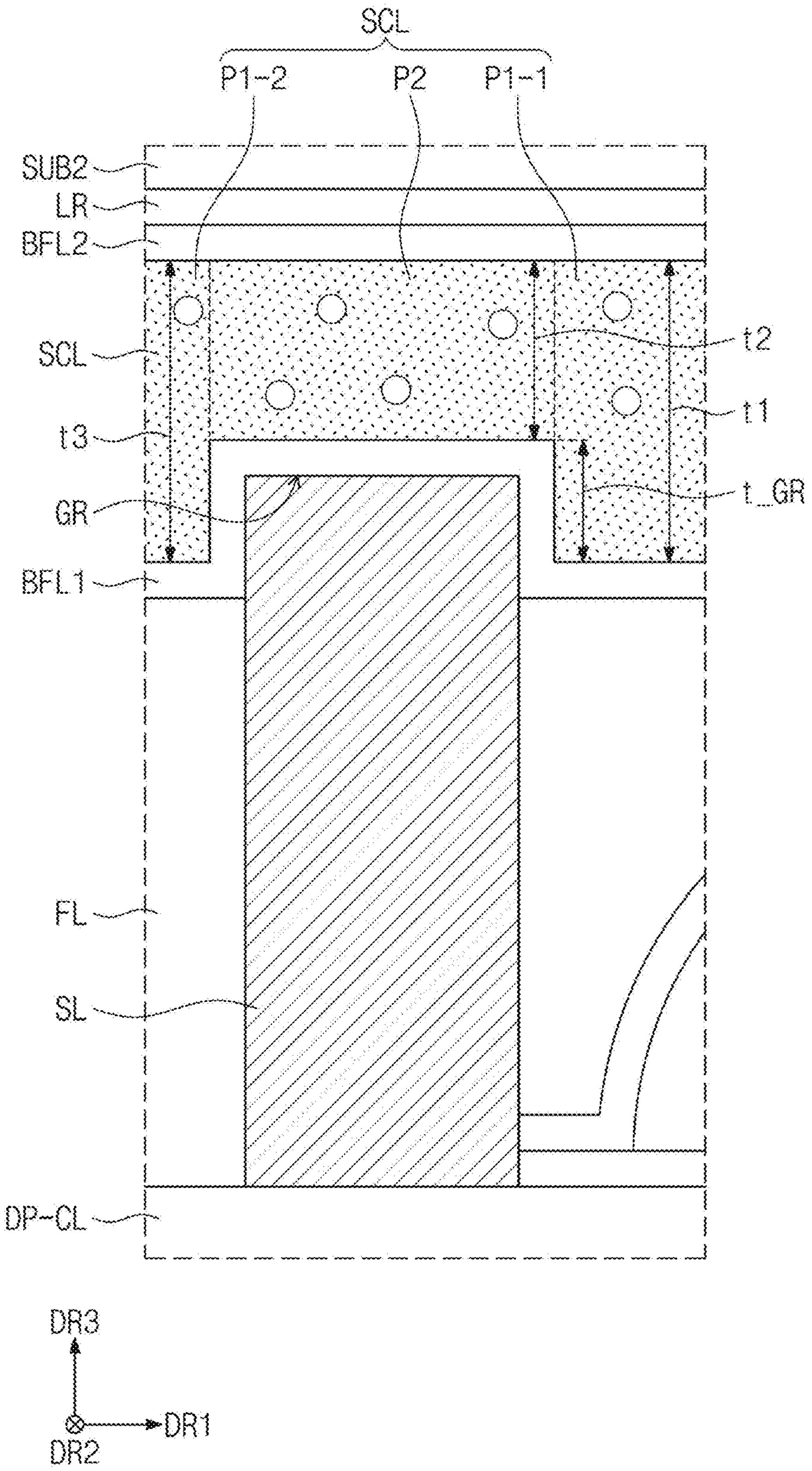
FIG. 4B is an enlarged view of a portion of the display device illustrated in FIG. 4A.

FIG. 4A is a cross-sectional view of the display device along the line I-I' of FIG. 2. FIG. 4B is an enlarged view of the display device illustrated in FIG. 4A. The display device DD according to one or more embodiments of the present disclosure will be described with reference to FIGS. 4A and 4B. The same/similar reference numerals are used for the same/similar components described in FIG. 3, and a duplicated description thereof will be omitted.

The display device DD according to one or more embodiments may include the display panel DP (see FIG. 3) and the light control member LCM (see FIG. 3). The display panel DP and the light control member LCM may be spaced apart from each other with the sealing member SL interposed therebetween. The filling member FL may be filled between the display panel DP and the light control member LCM. The filling member FL may cover the encapsulation layer TFE.

The display panel DP (see FIG. 3) may include the base layer SUB1, the circuit layer DP-CL, the display element layer DP-OL, and the encapsulation layer TFE.

The base layer SUB1 may include a synthetic resin substrate or a glass substrate. The base layer SUB1 may include a first synthetic resin layer, a second synthetic resin layer, and an inorganic layer therebetween. The synthetic resin layer may include a thermosetting resin. For example, the synthetic resin layer may be a polyimide-based resin layer, and a material thereof is not particularly limited thereto. The synthetic resin layer may include at least one of an acrylic resin, a methacrylic resin, a polyisoprene resin, a vinyl resin, epoxy resin, a urethane resin, a cellulose resin, a siloxane resin, a polyamide resin, and a perylene resin.

The circuit layer DP-CL may be located on the base layer SUB1. The circuit layer DP-CL may include an insulation layer, a semiconductor pattern, a conductive pattern, a signal line, and the like. The insulation layer, a semiconductor layer, and a conductive layer are formed on the base layer SUB1 in a manner, such as coating and deposition, and the insulation layer, the semiconductor layer, and the conductive layer may be selectively patterned through a plurality of photolithography processes. Accordingly, the semiconductor pattern, the conductive pattern, and the signal line may be formed on the circuit layer DP-CL. The circuit layer DP-CL may include a transistor, a buffer layer, and a plurality of insulation layers.

The display element layer DP-OL may be located on the circuit layer DP-CL, and may include a light-emitting element and a pixel-defining film PDL. The light-emitting element may include a first electrode AE, a second electrode CE facing the first electrode AE, and a common layer CML located between the first electrode AE and the second electrode CE. The common layer CML may include a hole transport area, a light-emitting layer, and an electron transport area.

The pixel-defining film PDL may be located on the circuit layer DP-CL, and may cover a portion of the first electrode AE. An opening PDL-OP may be defined in the pixel-defining film PDL. The opening PDL-OP of the pixel-defining film PDL exposes at least a portion of the first electrode AE.

The first electrode AE may be located on the circuit layer DP-CL. The first electrode AE may be an anode or a cathode. Further, the first electrode AE may be a pixel electrode, a transmissive electrode, a semi-transmissive electrode, or a reflective electrode.

The hole transport area may be located on the first electrode AE. The hole transport area may include at least one of a hole transport layer, a hole injection layer, and an electron-blocking layer.

The light-emitting layer may be located on the hole transport area. The light-emitting layer may generate a source light beam. In the display device DD according to one or more embodiments, the light-emitting layer emits a blue light beam, and accordingly, the blue light beam may serve as the source light beam.

The light-emitting layer may have a multi-layer structure having a single layer made of a single material, a single layer made of a plurality of different materials, or a plurality of layers made of a plurality of different materials. The light-emitting layer may include a fluorescent or phosphorescent material. In the light-emitting element according to one or more embodiments, the light-emitting layer may include a light-emitting material, such as an organic light-emitting material, a metal organic complex, or a quantum dot.

The electron transport area may be located on the light-emitting layer. The electron transport area may include at least one of an electron injection layer, an electron transport layer, and a hole-blocking layer.

The second electrode CE may be located on the electron transport area. The second electrode CE may be a common electrode. The second electrode CE may be a cathode or an anode, but the present disclosure is not limited thereto. For example, if the first electrode AE is the anode, the second electrode CE may be the cathode, or if the first electrode AE is the cathode, the second electrode CE may be the anode. The second electrode CE may be a transmissive electrode, a semi-transmissive electrode, or a reflective electrode.

The encapsulation layer TFE is located on the display element layer DP-OL. The encapsulation layer TFE may include a first inorganic layer INL1, an organic layer OL, and a second inorganic layer INL2. However, the present disclosure is not limited thereto, and the encapsulation layer TFE may further include a plurality of inorganic layers and a plurality of organic layers. The encapsulation layer TFE functions to reduce or prevent external moisture or oxygen intruding into the light-emitting layer and reducing the reliability of the display device DD.

The first inorganic layer INL1 is located on the second electrode CE. The first inorganic layer INL1 may reduce or prevent external moisture or oxygen intruding into the light-emitting layer. The first inorganic layer INL1 may include a silicon nitride, a silicon oxide, or a combination thereof. The first inorganic layer INL1 may be formed through a deposition process.

The organic layer OL is located on the first inorganic layer INL1. The organic layer OL may provide a flat surface on the first inorganic layer INL1. A surface state of the first inorganic layer INL1 may not be smooth, and may be curved, and/or fine particles formed in a process of manufacturing the display device DD may remain on the first inorganic layer INL1. The organic layer OL may be formed on the first inorganic layer INL1, and may block an influence of the surface state of an upper surface of the first inorganic layer INL1 on components formed on the organic layer OL. The organic layer OL may include an organic material, and may be formed through a solution process, such as a spin coating process, a slit coating process, or an inkjet process.

The second inorganic layer INL2 is located on the organic layer OL to cover the organic layer OL. The second inorganic layer INL2 may include a silicon nitride, a silicon oxide, or a combination thereof. Because the organic layer OL provides a flat surface, the second inorganic layer INL2 may also be formed more stably than if directly formed on the first inorganic layer INL1. The second inorganic layer INL2 may be formed through a deposition process. An operation of hydrogen-plasma-treating a surface of the organic layer OL may be further included between an operation of forming the organic layer OL and an operation of forming the second inorganic layer INL2. If the surface of the organic layer OL is hydrogen-plasma-treated, the second inorganic layer INL2 may be deposited more evenly on the surface of the organic layer OL.

In one or more embodiments, dam patterns may be arranged in the non-display area NDA, and may surround at least a portion of the display area DA. The dam patterns may reduce or prevent an overflow phenomenon in which the organic material for forming the organic layer OL overflows to an outside of the dam patterns in a process of forming the display device DD. The organic layer OL may have a boundary defined by any one of the dam patterns. The dam patterns may have a single-layer/multi-layer structure.

The display device DD may include a non-light-emitting area(s) NPXA and light-emitting areas PXA-R, PXA-G, and PXA-B. The light-emitting areas PXA-R, PXA-G, and PXA-B may be areas through which light beams generated by the light-emitting elements are emitted. The pixel-defining film PDL may define the light-emitting areas PXA-R, PXA-G, and PXA-B. The light-emitting areas PXA-R, PXA-G, and PXA-B and the non-light-emitting area NPXA may be distinguished by the pixel-defining film PDL.

The light-emitting areas PXA-R, PXA-G, and PXA-B may be spaced apart from each other on a plane. The light-emitting areas PXA-R, PXA-G, and PXA-B may be classified according to colors of the light beams generated by the light-emitting elements. FIG. 4A illustrates the three light-emitting areas PXA-R, PXA-G, and PXA-B that emit a red light beam, a green light beam, and the blue light beam. For example, the display device DD of one or more embodiments may include the red light-emitting area PXA-R, the green light-emitting area PXA-G, and the blue light-emitting area PXA-B that are distinguished from each other.

The light-emitting areas PXA-R, PXA-G, and PXA-B may have different areas according to the colors emitted from the light-emitting layer of the light-emitting element. In this case, the area may mean an area if viewed on a plane defined by the first direction DR1 and the second direction DR2. In the display device DD of one or more embodiments, the blue light-emitting area PXA-B corresponding to a first light-emitting element that emits the blue light beam may have the largest area, and the green light-emitting area PXA-G corresponding to a second light-emitting element that emits the green light beam may have the smallest area. However, the present disclosure is not limited thereto. The light-emitting areas PXA-R, PXA-G, and PXA-B may emit light beams having colors other than those of the red light beam, the green light beam, and the blue light beam, the light-emitting areas PXA-R, PXA-G, and PXA-B may have the same area, or the light-emitting areas PXA-R, PXA-G, and PXA-B may be provided in an area ratio that is different from that illustrated in FIG. 4A.

The light-emitting areas PXA-R, PXA-G, and PXA-B may be areas distinguished from each other by the pixel-defining film PDL. The non-light-emitting areas NPXA may be areas between the neighboring light-emitting areas PXA-R, PXA-G, and PXA-B, and may be areas corresponding to the pixel-defining film PDL. Meanwhile, in the present specification, each of the light-emitting areas PXA-R, PXA-G, and PXA-B may correspond to a pixel. The pixel-defining film PDL may distinguish the light-emitting elements from each other. The light-emitting layers of the light-emitting elements may be arranged in respective openings PDL-OP defined by the pixel-defining film PDL, and thus may be distinguished from each other.

The color filter layer CFL, the low refractive layer LR, and a light control layer CCL may be sequentially stacked and formed on the rear surface of the base substrate SUB2 in the third direction DR3.

The color filter layer CFL may be located under the base substrate SUB2. The color filter layer CFL may include first to third filters CF1, CF2, and CF3. The color filter layer CFL may filter light beams that pass through the light control layer CCL. The color filter layer CFL may reduce or prevent degradation of color purity of the display device DD, and may reduce an external light reflectance of the display device DD.

The first to third filters CF1, CF2, and CF3 may be arranged to correspond to the blue light-emitting area PXA-B, the green light-emitting area PXA-G, and the red light-emitting area PXA-R, respectively.

The first filter CF1 may transmit the source light beam, the second filter CF2 may transmit a second light beam, and the third filter CF3 may transmit a third light beam. For example, the first filter CF1 may be a blue filter, the second filter CF2 may be a green filter, and the third filter CF3 may be a red filter.

Each of the filters CF1, CF2, and CF3 may include a polymer photosensitive resin and a pigment or dye. The first filter CF1 may include a blue pigment or dye, the second filter CF2 may include a green pigment or dye, and the third filter CF3 may include a red pigment or dye. However, the present disclosure is not limited thereto, and the first filter CF1 may include the polymer photosensitive resin and may not include the pigment or dye. The first filter CF1 may be transparent. The first filter CF1 may be formed of a transparent photosensitive resin.

The low refractive layer LR may be located under the color filter layer CFL, and may cover, or overlap, the color filter layer CFL. The low refractive layer LR may increase the efficiency of visually recognized light to the outside by adjusting transmittances of the light beams provided from the light control layer CCL (see FIG. 4A). The low refractive layer LR may be in contact with a lower surface of the base substrate SUB2 exposed from the color filter layer CFL.

The bank BK may be located under the color filter layer CFL. The bank BK may be located to correspond to the non-light-emitting area NPXA. The bank BK may be a black matrix. The bank BK may include an organic light-blocking material or an inorganic light-blocking material including a black pigment or black dye. The bank BK may reduce or prevent a light leakage phenomenon, and may distinguish boundaries between the adjacent filters CF1, CF2, and CF3. Further, in one or more embodiments, the bank BK may be formed as a blue filter.

The first filter CF1, the second filter CF2, and the third filter CF3 all may overlap each other at regions corresponding to the non-light-emitting area NPXA. In this case, like the bank BK, a portion at which the filters CF1, CF2, and CF3 all overlap each other may function to reduce or prevent the light leakage phenomenon, and to distinguish the boundaries between the adjacent filters CF1, CF2, and CF3.

Second and third light controllers CCP2 and CCP3 may include a base resin and quantum dots mixed with (or dispersed in) the base resin. In one or more embodiments, the second and third light controllers CCP2 and CCP3 may be defined as quantum dot patterns, and may include different quantum dots. The base resin, which is a medium in which the quantum dots are dispersed, may be made of various resin compositions that may generally be referred to as binders. However, the present disclosure is not limited thereto, and in the present specification, any medium may be referred to as the base resin regardless of a name, an additional other function, a constituent material, or the like thereof as long as the quantum dots may be dispersed and arranged in the medium. The base resin may be a polymer resin. For example, the base resin may be an acrylic resin, a urethane resin, a silicone resin, an epoxy resin, or the like. The base resin may be a transparent resin.

The quantum dots may be particles that convert a wavelength of an input light beam. The quantum dots are materials having a crystal structure having a size of several nanometers, include hundreds to thousands of atoms, and exhibit a quantum confinement effect in which an energy band gap increases due to a small size thereof. If a light beam having a wavelength having higher energy than that of the band gap is input to the quantum dots, the quantum dots absorb the light beam, become excited, and fall to the ground state while emitting a light beam having a corresponding wavelength. The emitted light beam having the wavelength has a value corresponding to the band gap. Light emission characteristics by the quantum confinement effect may be adjusted by adjusting the size, the composition, or the like of the quantum dots. A diameter of the quantum dots according to one or more embodiments may be in a range of, for example, about 1 nm to about 10 nm.

The quantum dots may be synthesized by a wet chemical process, a metal organic chemical vapor deposition (MOCVD) process, a molecular beam epitaxy (MBE) process, or similar processes. The wet chemical process is a method of growing quantum dot particle crystals after mixing an organic solvent and a precursor material. If the crystals are grown, the organic solvent may naturally serve as a dispersant coordinated to a quantum dot crystal surface and may adjust the growth of the crystals. Thus, in the wet chemical process, the growth of the quantum dot particles may be controlled through a process that is easier and cheaper than a vapor deposition method, such as the MOCVD or the MBE.

The quantum dots may include a Group III-VI compound, a Group II-VI compound, a Group III-V compound, a Group I-III-VI compound, a Group IV-VI compound, a Group IV element or compound, or a combination thereof.

Example of the Group III-VI compound may include binary compounds, such as GaS, $Ga_2S3$, GaSe, $Ga_2Se_3$, GaTe, InS, InSe, $In_2Se_3$, and/or InTe, ternary compounds, such as $InGaS_3$, and/or $InGaSe_3$, and/or a combination thereof.

Examples of the Group II-VI compound may include binary compounds, such as CdS, CdSe, CdTe, ZnS, ZnSe, ZnTe, ZnO, HgS, HgSe, HgTe, MgSe, and/or MgS, ternary compounds, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS, quaternary compounds, such as CdZnSeS, CdZnSeTe, CdZnSTe, CdHgSeS, CdHgSeTe, CdHgSTe, HgZnSeS, HgZnSeTe, and/or HgZnSTe, or a combination thereof. Meanwhile, the Group II-VI compound may further include a Group I metal and/or a Group IV element. A Group I-II-VI compound may be selected from CuSnS or CuZnS, and/or a Group II-IV-VI compound may be selected from ZnSnS or the like. A Group I-II-IV-VI compound may be selected from quaternary compounds selected from the group including $Cu_2ZnSnS_2$, $Cu_2ZnSnS_4$, $Cu_2ZnSnSe_4$, $Ag_2ZnSnS_2$, and/or mixtures thereof.

Examples of the Group III-V compound may include binary compounds, such as GaN, GaP, GaAs, GaSb, AlN, AlP, AlAs, AlSb, InN, InP, InAs, and/or InSb, ternary compounds, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb, quaternary compounds, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb, or a combination thereof. Meanwhile, the Group III-V compound may further include a Group II element. Examples of the Group III-V compound further including the Group II element may include InZnP, InGaZnP, InAlZnP, or the like.

Examples of the Group I-III-VI compound may include ternary compounds, such as AgInS, $AgInS_2$, $AgInSe_2$, AgGaS, $AgGaS_2$, $AgGaSe_2$, CuInS, $CuInS_2$, $CuInSe_2$, $CuGaS_2$, $CuGaSe_2$, $CuGaO_2$, $AgGaO_2$, and/or $AgAlO_2$, quaternary compounds, such as $AgInGaS_2$ and/or $AgInGaSe_2$, or a combination thereof.

Examples of the Group IV-VI compound may include binary compounds, such as SnS, SnSe, SnTe, PbS, PbSe, and/or PbTe, ternary compounds, such as SnSeS, SnSeTe, SnSTe, PbSeS, PbSeTe, PbSTe, SnPbS, SnPbSe, and/or SnPbTe, quaternary compounds, such as SnPbSSe, SnPbSeTe, and/or SnPbSTe, or a combination thereof.

Examples of the Group II-IV-V compound may be a ternary compound selected from the group including ZnSnP, $ZnSnP_2$, $ZnSnAs_2$, $ZnGeP_2$, $ZnGeAs_2$, $CdSnP_2$, and/or $CdGeP_2$, and/or mixtures thereof.

The Group IV element or compound may include single element compounds, such as Si and/or Ge, binary compounds, such as SiC and/or SiGe, or a combination thereof.

Elements included in a multi-element compound, such as the binary compound, the ternary compound, and/or the quaternary compound may be present inside particles at a uniform concentration or a non-uniform concentration. That is, the chemical formula means the type of elements included in the compound, and an element ratio in the compound may be different. For example, $AgInGaS_2$ may mean $AgInxGa_{(1-x)}S_2$ (x is a real number between 0 and 1).

Meanwhile, the quantum dot may have a single structure or a core-shell dual structure in which the concentrations of elements included in the corresponding quantum dot are substantially uniform. For example, a material included in the core and a material included in the shell may be different from each other.

The shell of the quantum dot may serve as a protective layer for maintaining semiconductor properties by reducing or preventing changes of chemical properties of the core and/or as a charging layer for providing electrophoretic properties to the quantum dot. The shell may be a single layer or a multi-layer. An interface between the core and the shell may have a concentration gradient in which a concentration of the element present in the shell decreases toward a center. The core/shell structure may have a concentration gradient in which the concentration of the element present in the shell decreases toward the core.

Examples of the shell of the quantum dot may include a metal or non-metal oxide, a compound, or a combination thereof. Examples of the metal or non-metal oxide may include binary compounds, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, ternary compounds, such as $MgAl_2O_4$, $CoFe_2O_4$, $NiFe_2O_4$, and/or $CoMn_2O_4$, or a combination thereof. Examples of the compound may include the Group III-VI compound, the Group II-VI compound, the Group III-V compound, the Group I-III-VI compound, the Group IV-VI compound, or a combination thereof, as described in the present specification. For example, the compound may include CdS, CdSe, CdTe, ZnS, ZnSe, ZnTe, ZnSeS, ZnTeS, GaAs, GaP, GaS, GaSe, AgGaS, $AgGaS_2$, GaSb, HgS, HgSe, HgTe, InAs, InP, InGaP, InSb, AlAs, AlP, AlSb, or a combination thereof.

Elements included in a multi-element compound, such as the binary compound and the ternary compound may be present inside particles at a uniform concentration or a non-uniform concentration. That is, the chemical formula means the type of elements included in the compound, and an element ratio in the compound may be different.

The quantum dot may have a full width of half maximum (FWHM) of a light-emitting wavelength spectrum of about 45 nm or less, for example about 40 nm or less, and as another example about 30 nm or less, and the color purity and color reproducibility may be improved in this range. Further, because a light beam emitted through this quantum dot is emitted in all directions, an optical viewing angle may be improved.

Further, a shape of the quantum dot may include a spherical shape, a pyramid shape, a multi-arm shape, or cubic nano-particles, nano-tubes, nano-wires, nano-fibers, nano-plate-shaped particles, or the like.

Because the energy band gap may be adjusted by adjusting the size of the quantum dot or by adjusting an element ratio in the quantum dot compound, light beams having various wavelengths may be obtained in a quantum dot light-emitting layer. Thus, by using the above-described quantum dot (e.g., by using quantum dots having different sizes or having different element ratios in the quantum dot compound), the light-emitting element that emits the light beams having various wavelengths may be implemented. In detail, adjustment of the size of the quantum dot or the element ratio in the quantum dot compound may be selected so that the red light beam, the green light beam, and/or the blue light beam are emitted. Further, the quantum dots may combine light beams having various colors to emit a white light beam.

In one or more embodiments, the third light controller CCP3 may be a red quantum dot pattern that absorbs the source light beam, and that then generates the red light beam. The second light controller CCP2 may be a green quantum dot pattern that absorbs the source light beam, and that then generates the green light beam. The second light controller CCP2 and the third light controller CCP3 may also further include scatterers.

A first light controller CCP1 may include scatterers mixed with (or dispersed in) an organic material. The first light controller CCP1 may be a scattering pattern that scatters the source light beam. The scatterers may be particles having a relatively high density or specific gravity. The scattering particles may include a titanium dioxide or silica-based nanoparticles.

The light control layer CCL may include the first light controller CCP1 that transmits the source light beam, the second light controller CCP2 including a first quantum dot QD1 configured to converts the source light beam into the second light beam, and the third light controller CCP3 including a second quantum dot QD2 that converts the source light beam into the third light beam. The second light beam may be a light beam having a longer wavelength range than that of the source light beam, and the third light beam may be a light beam having a longer wavelength range than that of the source light beam and the second light beam. For example, the source light beam may be the blue light beam, the second light beam may be the green light beam, and the third light beam may be the red light beam.

The same content as that of the quantum dot according to one or more embodiments may be applied to at least one of the quantum dots QD1 or QD2 included in the light controllers CCP1, CCP2, and/or CCP3. For example, the same content as that of the quantum dot according to one or more embodiments may be applied to the first quantum dot QD1 configured to convert the source light beam into the second light beam.

The light control layer CCL may further include a scatterer SP. The first light controller CCP1 may not include the quantum dot, and may include the scatterer SP. The second light controller CCP2 may include the first quantum dot QD1 and the scatterer SP. The third light controller CCP3 may include the second quantum dot QD2 and the scatterer SP.

The scatterer SP may be inorganic particles. For example, the scatterer SP may include at least one of $TiO_2$, ZnO, $Al_2O_3$, $SiO_2$, or hollow silica. The scatterer SP may include at least one of $TiO_2$, ZnO, $Al_2O_3$, $SiO_2$, or hollow silica or may be a mixture of two or more materials selected from $TiO_2$, ZnO, $Al_2O_3$, $SiO_2$, or hollow silica.

The first light controller CCP1, the second light controller CCP2, and the third light controller CCP3 may respectively include base resins BR1, BR2, and BR3 that disperse the quantum dots QD1 and QD2 and the scatterer SP. In one or more embodiments, the first light controller CCP1 may include the scatterer SP dispersed in the first base resin BR1. The second light controller CCP2 may include the first quantum dot QD1 and the scatterer SP dispersed in the second base resin BR2. The third light controller CCP3 may include the second quantum dot QD2 and the scatterer SP dispersed in the third base resin BR3.

The first to third light controllers CCP1, CCP2, and CCP3 may be arranged to respectively correspond to first to third openings BK-OP defined in the bank BK.

The base resins BR1, BR2, and BR3, which are mediums in which the quantum dots QD1 and QD2 and the scatterer SP are dispersed, may be made of various resin compositions that may generally be referred to as binders. For example, the base resins BR1, BR2, and BR3 may be an acrylic resin, a urethane resin, a silicone resin, an epoxy resin, or the like. The base resins BR1, BR2, and BR3 may be transparent resins. In one or more embodiments, the first base resin BR1, the second base resin BR2, and the third base resin BR3 may be the same or different from each other.

The first barrier layer BFL1 may be located under the light control layer CCL. The first barrier layer BFL1 may serve to reduce or prevent intrusion of moisture and/or oxygen (hereinafter, referred to as "moisture/oxygen"). The first barrier layer BFL1 may be located under the light controllers CCP1, CCP2, and CCP3, and may reduce or prevent exposure of the light controllers CCP1, CCP2, and CCP3 to moisture/oxygen. Meanwhile, the first barrier layer BFL1 may cover the light controllers CCP1, CCP2, and CCP3. Further, the second barrier layer BFL2 may also be provided between the light controllers CCP1, CCP2, and CCP3 and the low refractive layer LR.

The barrier layers BFL1 and BFL2 may include at least one inorganic layer. That is, the barrier layers BFL1 and BFL2 may include an inorganic material. For example, the barrier layers BFL1 and BFL2 may be made of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and/or a silicon oxy nitride, or may include a metal thin film having a secured light transmittance. Meanwhile, the barrier layers BFL1 and BFL2 may further include an organic film. The barrier layers BFL1 and BFL2 may be provided in a single layer or multiple layers.

The step compensation layer SCL may be located between the base layer SUB1 and the base substrate SUB2 to overlap the non-display area NDA. The step compensation layer SCL may compensate for a step formed under the light control member LCM between an area in which the color filter layer CFL is located and an area in which the color filter layer CFL is not located. Referring to FIG. 4A, the area in which the color filter layer CFL is not located may be present in the non-display area NDA under the light control member LCM. Accordingly, a step may be formed between the display area DA and the non-display area NDA under the light control member LCM to correspond to a thickness CFT of the color filter layer CFL. The step compensation layer SCL may be located to correspond to the area in which the color filter layer CFL is not located. The step compensation layer SCL may have a thickness corresponding to the thickness CFT of the color filter layer CFL in at least some areas thereof.

Referring to FIG. 4B, the step compensation layer SCL may include a first part P1 and a second part P2. The first part P1 may include a $(1\text{-}1)^{th}$ part P1-1 and a $(1\text{-}2)^{th}$ part P1-2.

The $(1\text{-}1)^{th}$ part P1-1, the second part P2, and the $(1\text{-}2)^{th}$ part P1-2 may respectively correspond to a first thickness t1, a second thickness t2, and a third thickness t3. In the present specification, a thickness of a corresponding part may refer to an average thickness of the corresponding part. For example, FIG. 4A illustrates that the $(1\text{-}1)^{th}$ part P1-1, the second part P2, and the $(1\text{-}2)^{th}$ part P1-2 respectively have the first thickness t1, the second thickness t2, and the third thickness t3 that are constant, but the present disclosure is not limited thereto. The first thickness t1, the second thickness t2, and the third thickness t3 may mean respective average thicknesses of the $(1\text{-}1)^{th}$ part P1-1, the second part P2, and the $(1\text{-}2)^{th}$ part P1-2.

The first thickness t1 may be the same as the third thickness t3. However, the present disclosure is not limited thereto, and the first thickness t1 and the third thickness t3 may be different from each other in a range in which visibility of the sealing member SL does not increase.

Referring to FIG. 4B, the first thickness t1 and the third thickness t3 may have values that are greater than that of the second thickness t2. As the step compensation layer SCL includes the parts P1-1, P2, and P1-2 having different thicknesses, a groove GR may be defined in the step compensation layer SCL. The groove GR may correspond to a recessed part or groove formed in a lower portion of the step compensation layer SCL. An inner surface of the step compensation layer SCL defining the groove GR may be covered by the first barrier layer BFL1. A portion of the sealing member SL may be located inside the groove GR covered by the first barrier layer BFL1.

A groove thickness t_GR may be defined as a difference between the first thickness t1 and the second thickness t2. As the groove thickness t_GR increases, a volume of the sealing member SL accommodated by the groove GR may increase. If the second thickness t2 or the first thickness t1 is adjusted, the groove thickness t_GR may also be adjusted accordingly.

According to the present disclosure, the step compensation layer SCL compensates for a step formed in the area in which the color filter layer CFL is not located, and the display panel DP and the light control member LCM are stably coupled to each other. Thus, external moisture/oxygen may be reduced or prevented from intruding into the display device DD through the sealing member SL. Accordingly, the display device DD having improved reliability may be provided.

Further, according to the present disclosure, as the color filter layer CFL is not located in the non-display area NDA, transparency in the non-display area NDA may be secured.

Because the sealing member SL has a light transmittance of less than 100%, the sealing member SL may be visible from the outside. However, because the second thickness t2 is less than those of the first thickness t1 and the third thickness t3, the second part P2 of the step compensation layer SCL has a higher light transmittance than those of the $(1\text{-}1)^{th}$ part P1-1 and the $(1\text{-}2)^{th}$ part P1-2 of the step compensation layer SCL. Accordingly, a deviation of the light transmittance of the light beam passing through the display device DD inside and outside an area in which the sealing member SL overlaps the step compensation layer SCL is reduced. Thus, a problem, wherein the sealing member SL is externally visible/visible from the outside, may be solved.

As a thickness of the step compensation layer SCL increases, the transmittance of the light beam passing through the step compensation layer SCL decreases. As the content of titanium dioxide contained in the step compensation layer SCL increases, the transmittance of the light beam passing through the step compensation layer SCL decreases. Thus, as the thickness of the step compensation layer SCL is adjusted, and as the content of the titanium dioxide in the step compensation layer SCL is adjusted, a degree to which the sealing member SL is visible from the outside may be changed. Thus, it is suitable to appropriately adjust the thickness of the step compensation layer SCL and the content of the titanium dioxide thereof, which will be described below in detail with reference to FIG. 6 and Tables 1 to 4.

FIGS. 5A to 5G are cross-sectional views illustrating operations of a method of manufacturing the display device according to one or more embodiments. In FIGS. 5A to 5F, for convenience of description, the base substrate SUB2 is located at a lowermost end, and components included in the display device DD (see FIG. 4A) other than the base substrate SUB2 are stacked in the third direction DR3. Thus, the components described as being positioned "under" the base substrate SUB2 in FIGS. 4A and 4B will be described as "on" the base substrate SUB2 if described with reference to FIGS. 5A to 5F.

An operation of providing a preliminary light control member P-LCM will be described with reference to FIG. 5A. In a process of forming the light control member LCM (see FIG. 4A), the preliminary light control member P-LCM may correspond to the light control member LCM in a state before the first barrier layer BFL1 (see FIG. 4A) is formed.

Figure 5A:
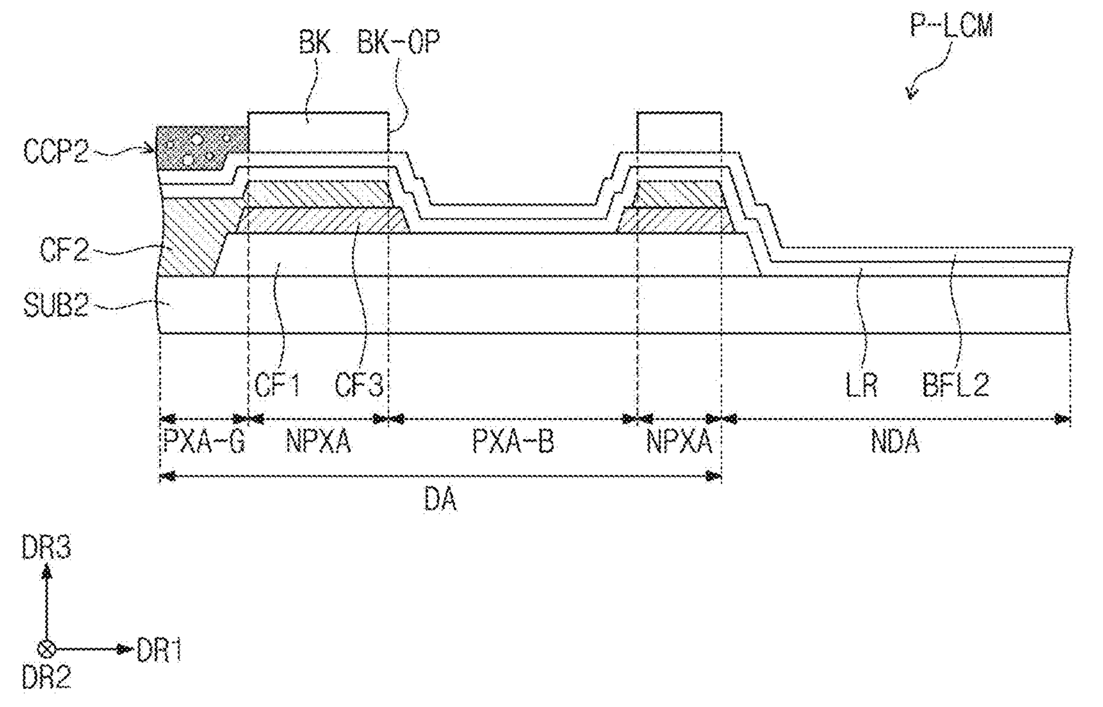
FIGS. 5A to 5G are cross-sectional views illustrating operations of a method of manufacturing the display device according to one or more embodiments.

The preliminary light control member P-LCM provided in an operation corresponding to FIG. 5A may include the base substrate SUB2, the color filter layers CF1, CF2, and CF3, the low refractive layer LR, the second barrier layer BFL2, the bank BK, the second light controller CCP2, and the third light controller CCP3 (see FIG. 4A). Components included in the preliminary light control member P-LCM correspond to the components included in the light control member LCM (see FIG. 4A), and thus a duplicated description thereof will be omitted.

Figure 5B:
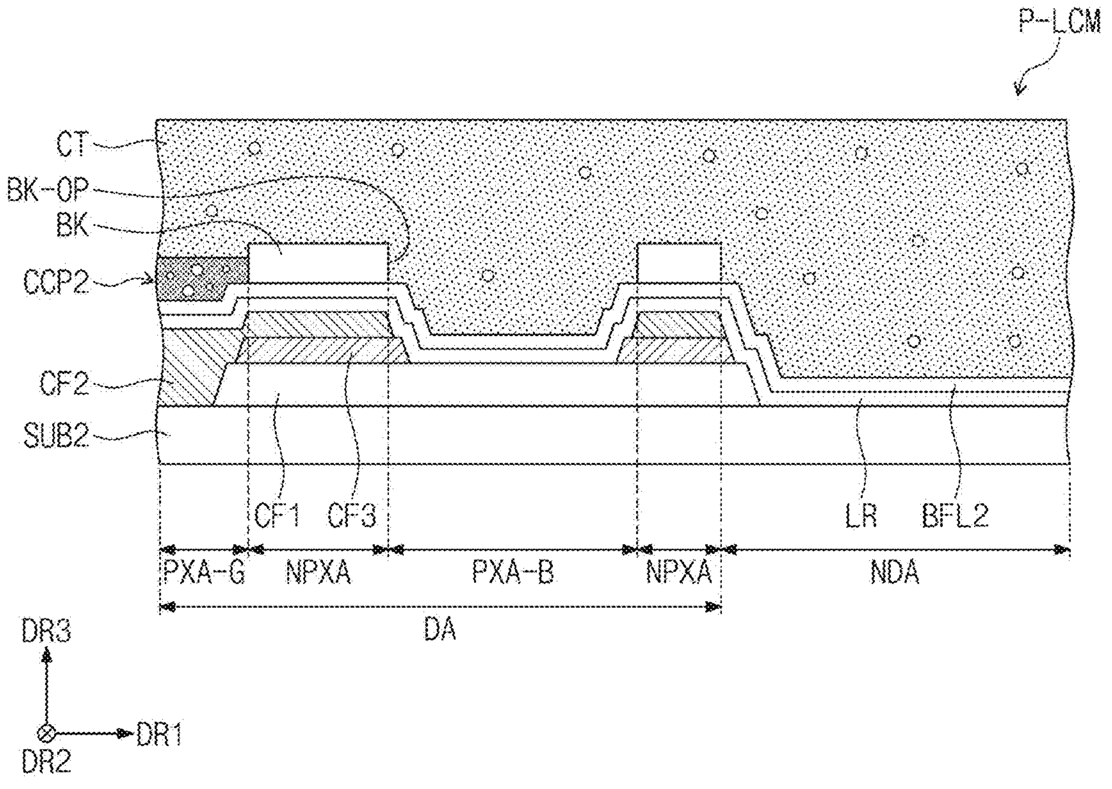

An operation of forming a coating layer CT including an organic material in which scatterers are dispersed on the preliminary light control member P-LCM will be described with reference to FIG. 5B.

A photoresist used in the operation of forming the coating layer CT may be the same material as a material constituting the first light controller CCP1 (see FIG. 4A). Thus, the photoresist may include the scatterer SP (see FIG. 4A) and the first base resin BR1 (see FIG. 4A) that disperses the scatterer SP. For example, the scatterer SP may include a titanium dioxide.

The material constituting the first light controller CCP1 does not include the quantum dots QD1 and QD2 (see FIG. 4A). The quantum dots QD1 and QD2 are relatively expensive among the materials constituting the light controllers CCP1, CCP2, and CCP3 (see FIG. 4A). Thus, the same material as the material constituting the first light controller CCP1, rather than the materials constituting the second and third light controllers CCP2 and CCP3, may be used as the photoresist, and thus relatively high economic efficiency may be secured.

An operation of placing, on the preliminary light control member P-LCM, a mask MK including a semi-transmissive part HPP in a portion corresponding to the non-display area NDA, and an operation of forming the step compensation layer SCL (see FIG. 4A) overlapping the non-display area NDA by etching a portion of the photoresist coating layer CT, will be described with reference to FIGS. 5C and 5D. For convenience of description, a description will be made assuming a negative photoresist process in FIGS. 5C and 5D. However, this is merely an example, and if a shape of the mask MK is changed, a positive photoresist process may be also performed.

The mask MK may include a light transmitting part MK-OP that completely transmits a light beam, a light-blocking part that completely blocks a light beam, and the semi-transmissive part HPP that transmits only a portion of a light beam. For example, the semi-transmissive part HPP may include a half tone pattern.

The mask MK may be located on the preliminary light control member P-LCM, and the mask MK may be irradiated with a light beam. For example, the light beam may correspond to an ultraviolet (UV) light beam.

The solubility of a portion of the coating layer CT, which overlaps the transmissive part of the mask MK, may decrease. The solubility of a portion of the coating layer CT, which overlaps the semi-transmissive part of the mask MK, may decrease. However, the amount of decrease in the solubility of one portion of the coating layer CT, which overlaps the semi-transmissive part of the mask MK, may be less than the amount of decrease in the solubility of another portion of the coating layer CT, which overlaps the transmissive part of the mask MK.

Thus, the step compensation layer SCL includes the $(1\text{-}1)^{th}$ part P1-1 having the first thickness t1, the second part P2 having the second thickness t2, and the $(1\text{-}2)^{th}$ part P1-2 having the third thickness t3. The portion of the coating layer CT, which overlaps the transmissive part of the mask MK, corresponds to the first parts P1-1 and P1-2 in the step compensation layer SCL. The portion of the coating layer CT, which overlaps the semi-transmissive part HPP of the mask MK, corresponds to the second part P2 having the second thickness t2 in the step compensation layer SCL.

The decrease in the solubility of the portion of the coating layer CT, which overlaps the semi-transparent part of the mask MK, may be less than the decrease in the solubility of the other portion of the coating layer CT, which overlaps the transmissive portion of the mask MK. Thus, the second thickness t2 may be less than the first thickness t1 and the third thickness t3.

Figure 5C:
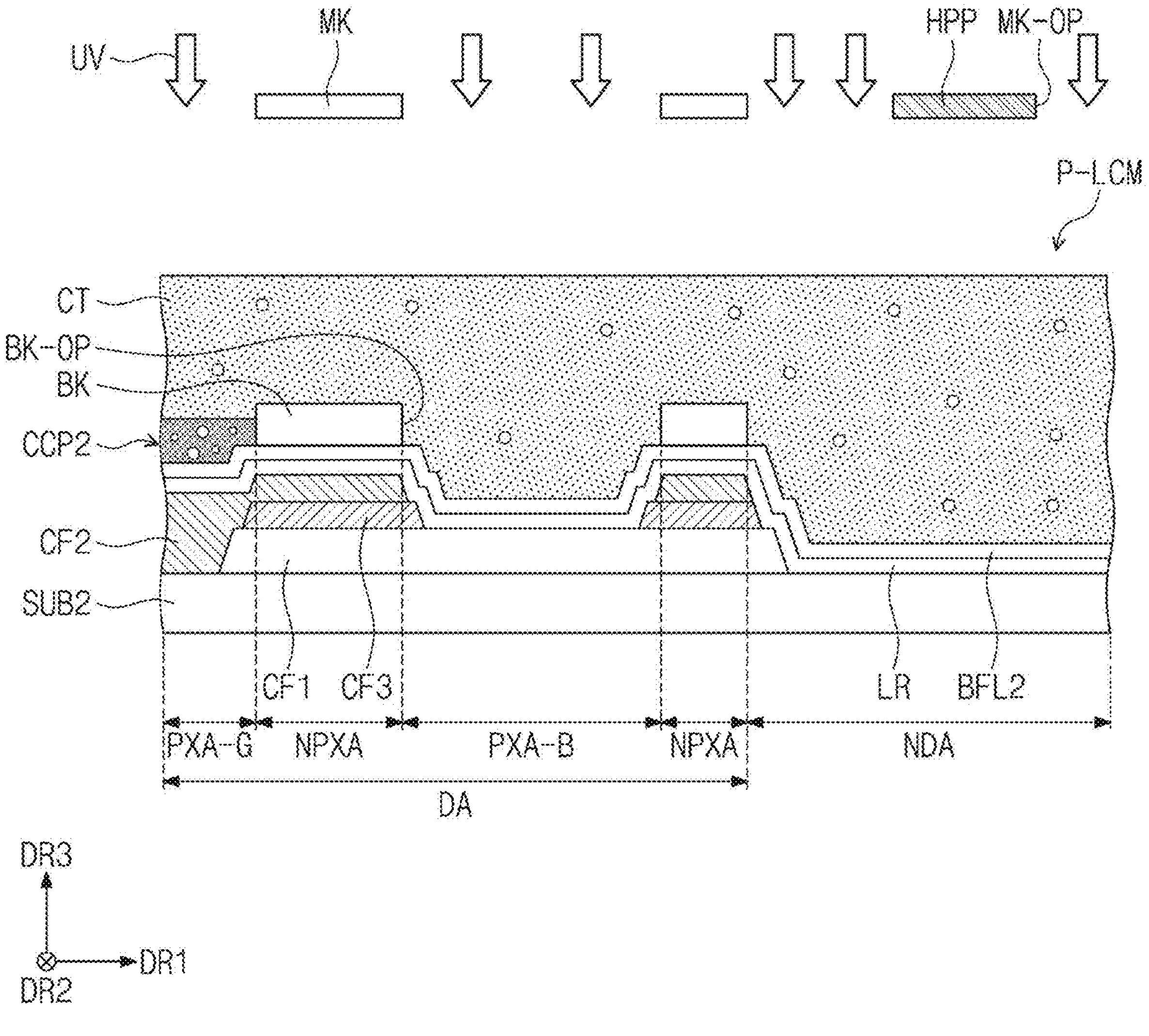
Figure 5D:
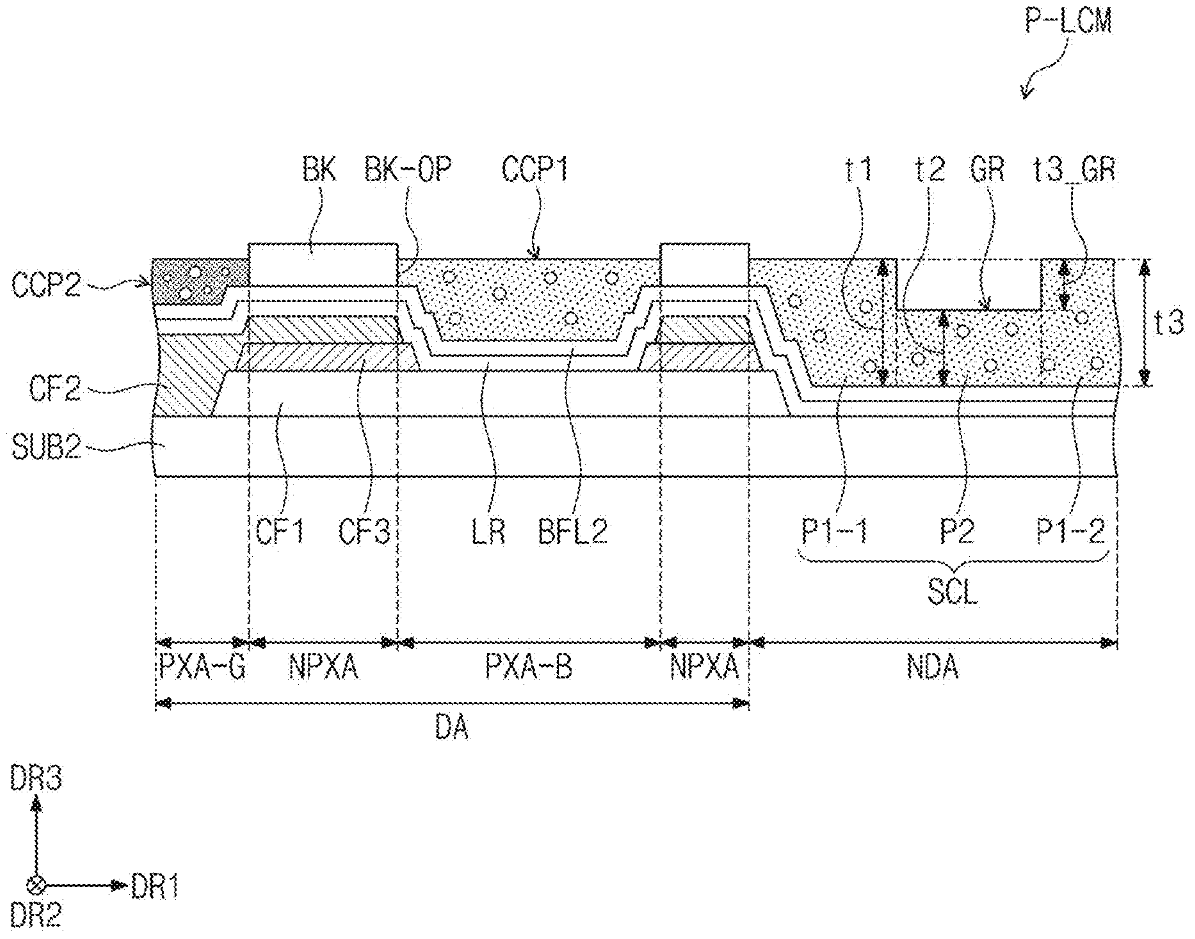

FIG. 5D illustrates that the first part P1 is divided into the $(1\text{-}1)^{th}$ part P1-1 and the $(1\text{-}2)^{th}$ part P1-2, and the second part P2 is located between the $(1\text{-}1)^{th}$ part P1-1 and the $(1\text{-}2)^{th}$ part P1-2. However, this is merely an example, and a position of the second part P2 inside the step compensation layer SCL may be adjusted by adjusting a width of the $(1\text{-}1)^{th}$ part P1-1 or the $(1\text{-}2)^{th}$ part P1-2.

As the step compensation layer SCL includes the first part P1 and the second part P2 having different thicknesses, the groove GR may be defined in the step compensation layer SCL. The groove GR may accommodate the sealing member SL (see FIG. 4). Accordingly, the sealing member SL may at least partially overlap the second part P2, and a width of the second part P2 in one direction is greater than or substantially equal to a width of the sealing member SL in the one direction.

Referring to FIGS. 5C and 5D, the operation of forming the step compensation layer SCL overlapping the non-display area NDA by etching the portion of the coating layer CT may be performed concurrently or substantially simultaneously with an operation of forming the first light controller CCP1 overlapping the display area DA by etching another portion of the coating layer CT. That is, in one process, the step compensation layer SCL and the first light controller CCP1 may be formed using one mask MK, and thus a process may be simplified, and costs may be reduced.

Figure 5E:
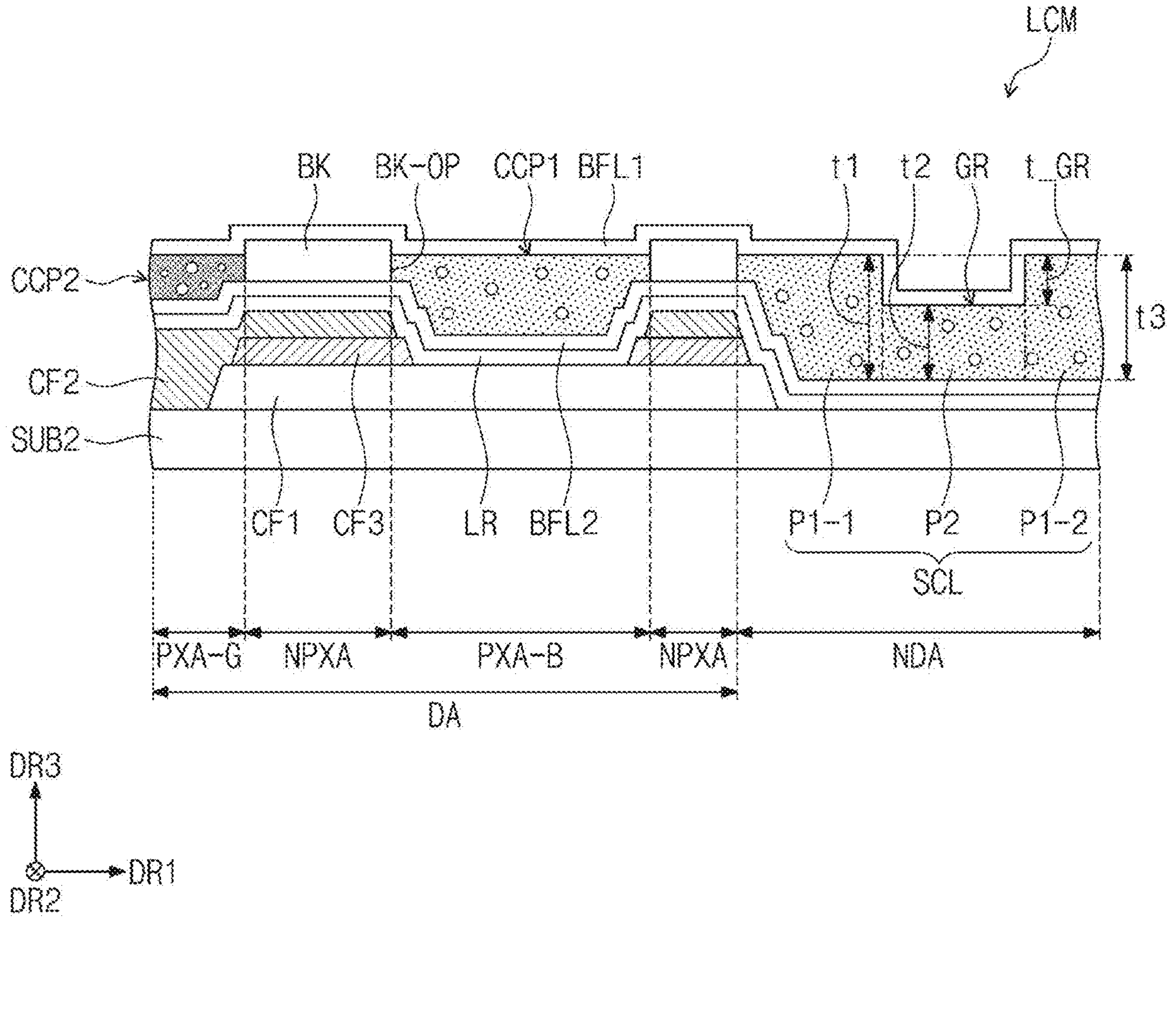

Thereafter, a process of forming the first barrier layer BFL1 on the preliminary light control member P-LCM will be described with reference to FIG. 5E.

The first barrier layer BFL1 may serve to reduce or prevent intrusion of the moisture/oxygen. The first barrier layer BFL1 may be located on the preliminary light control member P-LCM, and may reduce or prevent exposure of the light controllers CCP1, CCP2, and CCP3 (see FIG. 4A) and of the step compensation layer SCL to the moisture/oxygen. The first barrier layer BFL1 may include at least one inorganic layer. That is, the first barrier layer BFL1 may include an inorganic material. For example, the first barrier layer BFL1 may be made of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxy nitride, or may include a metal thin film having a secured light transmittance. Meanwhile, the first barrier layer BFL1 may further include an organic film. The first barrier layer BFL1 may be provided in a single layer or multiple layers. The light control member LCM may be defined by forming the first barrier layer BFL1 on the preliminary light control member P-LCM.

Figure 5F:
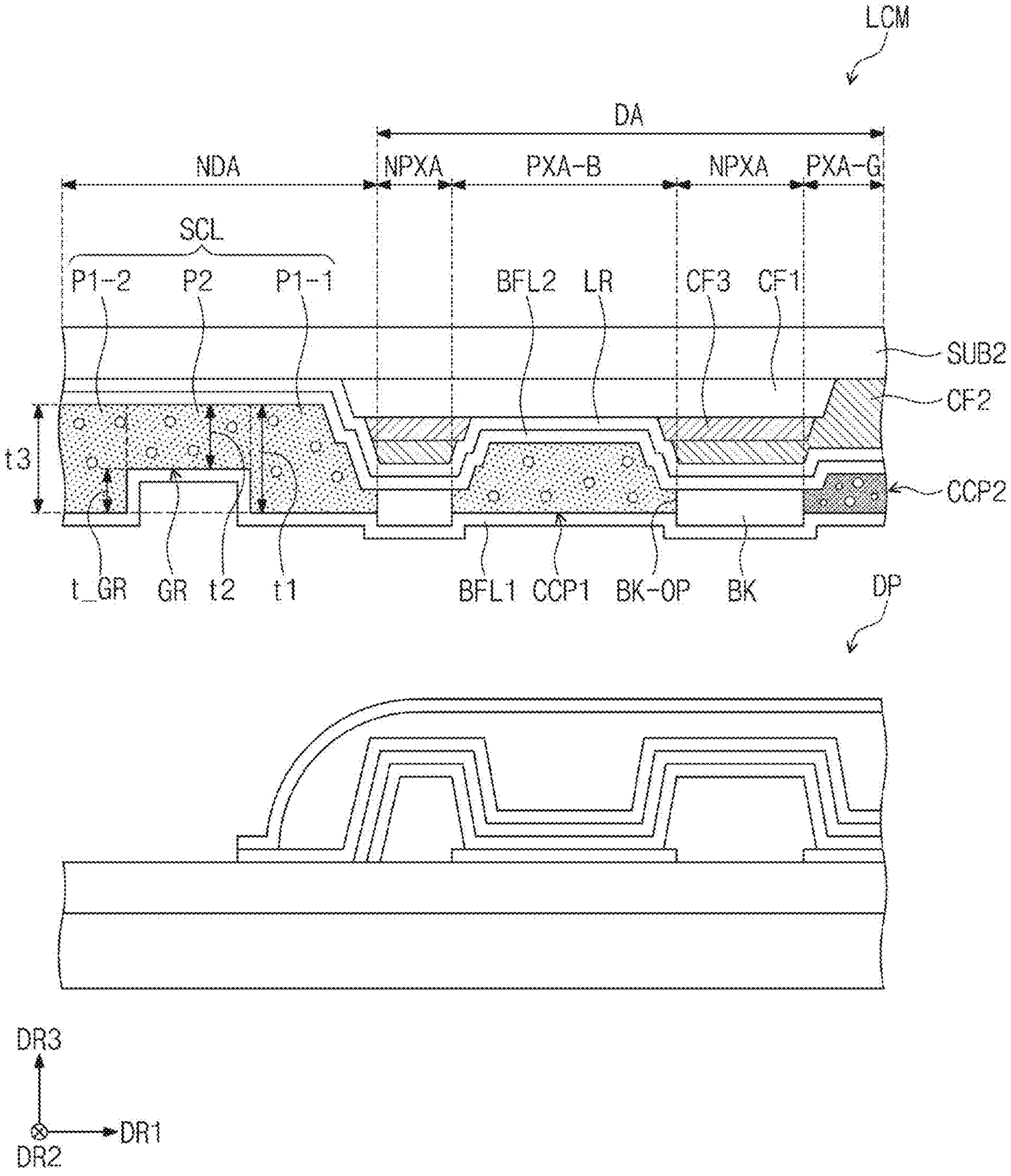
Figure 5G:
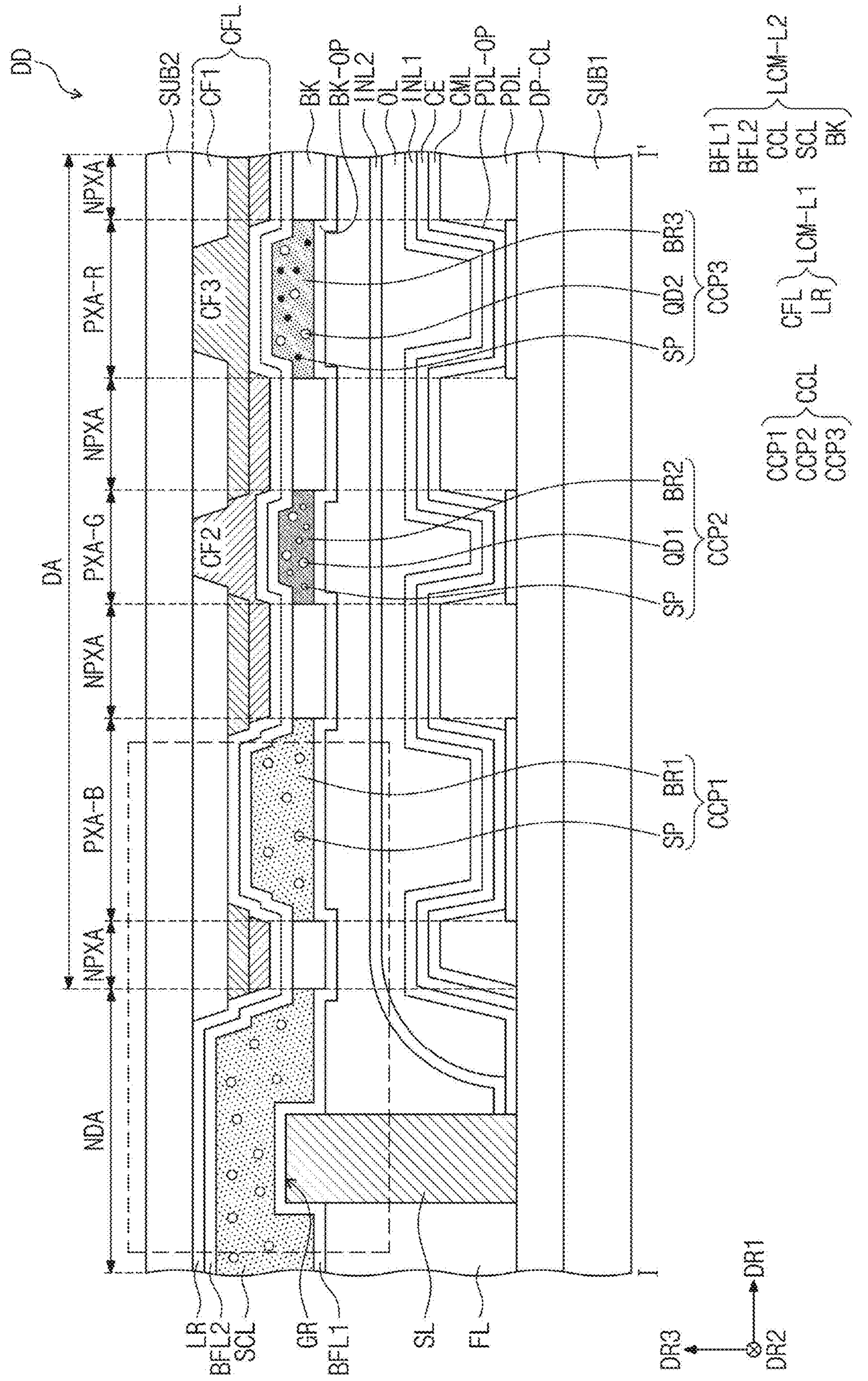

Thereafter, referring to FIG. 5F, a process of bonding the light control member LCM and the display panel DP may be progressed. Referring to FIG. 5G, the display device DD may be manufactured by filling the filling member FL, and by forming the sealing member SL between the light control member LCM and the display panel DP.

The display panel DP may include the base layer SUB1 (see FIG. 4A), the circuit layer DP-CL (see FIG. 4A), the display element layer DP-OL (see FIG. 4A), and the encapsulation layer TFE (see FIG. 4A). The base layer SUB1, the circuit layer DP-CL, the display element layer DP-OL, and the encapsulation layer TFE correspond to those described with reference to FIGS. 3 and 4A, and duplicated descriptions thereof will be omitted.

If the display panel DP is located on the light control member LCM, and if a separation distance between the display panel DP and the light control member LCM is narrowed, an empty space between the display panel DP and the light control member LCM may be filled with the filling member FL. The filling member FL may include a silicone, an epoxy, or an acrylic-based thermosetting material. However, the materials of the filling member FL are not limited to the above examples.

Further, the sealing member SL that overlaps the non-display area NDA may be formed between the display panel DP and the light control member LCM. The sealing member SL at least partially overlaps the second part P2. The sealing member SL serves to fix the display panel DP and the light control member LCM so that the display panel DP and the light control member LCM are spaced a distance (e.g., predetermined distance) from each other and to reduce or prevent intrusion of external oxygen or moisture.

Figure 6A:
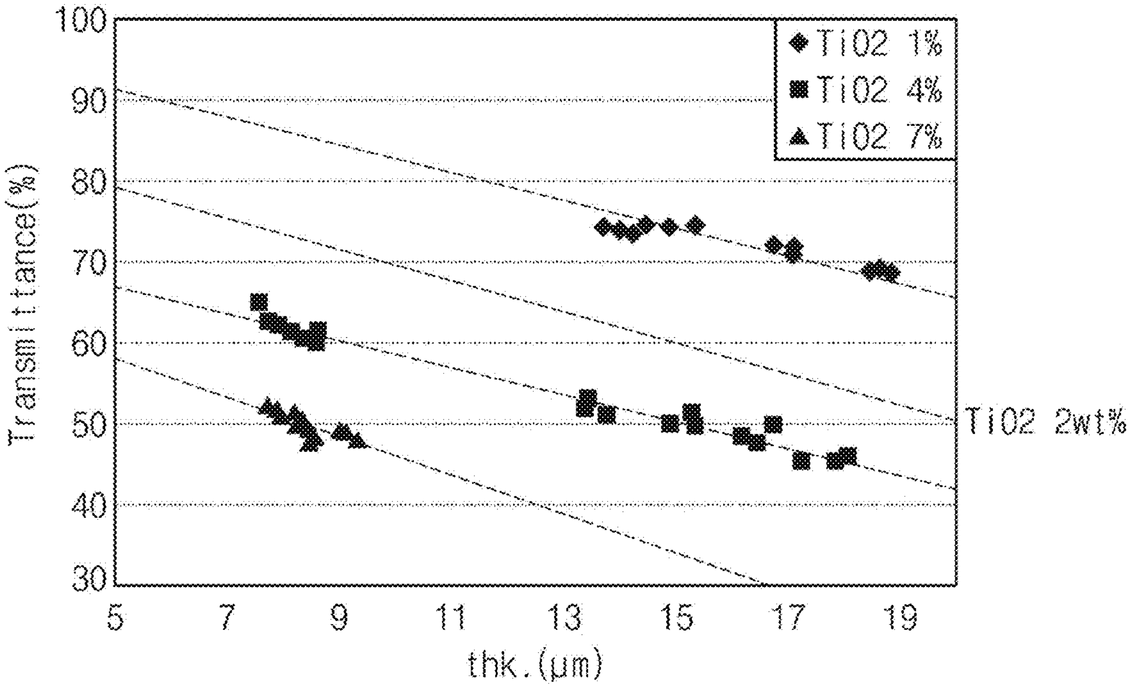
FIG. 6A is a graph of a light transmittance of a step compensation layer according to one or more embodiments.
Figure 6B:
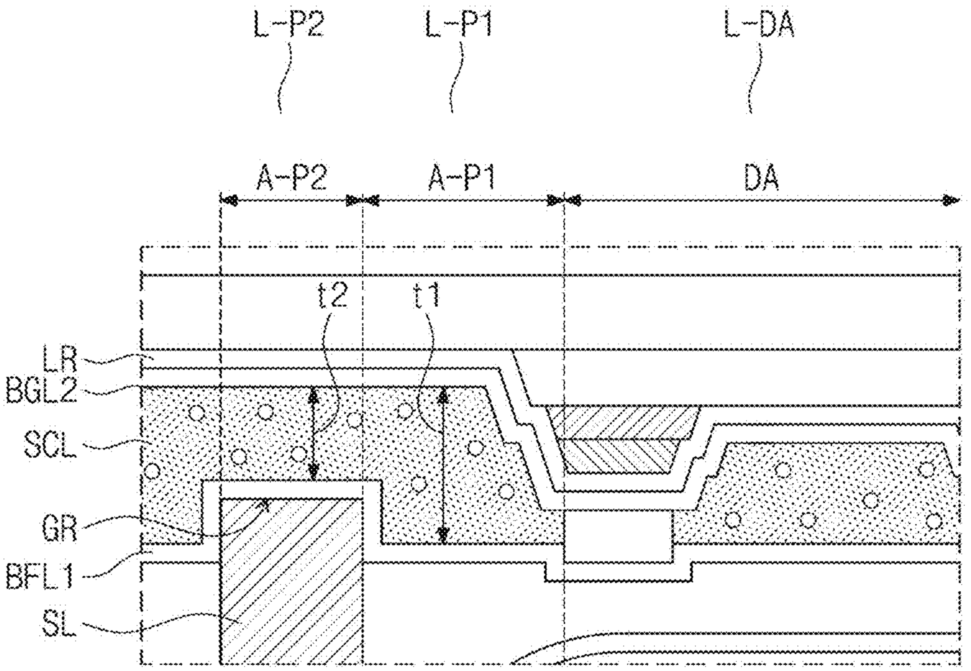
FIG. 6B is a cross-sectional view illustrating the display device and a light beam passing therethrough.

FIG. 6A is a graph of a light transmittance of a step compensation layer according to one or more embodiments. FIG. 6B is a cross-sectional view illustrating the display device and a light beam passing therethrough. The light transmittance according to the content of the titanium dioxide of the step compensation layer SCL (see FIG. 4A), and the thickness of the step compensation layer SCL will be described with reference to FIGS. 6A and 6B.

deviation between the light transmittance values of the first parts P1-1 and P1-2 of the step compensation layer SCL, the second part P2 of the step compensation layer SCL, and the display area DA may be reduced by adjusting the thickness of the step compensation layer SCL and/or by adjusting the content of the titanium dioxide included in the step compensation layer SCL.

For example, the step compensation layer SCL may has the thickness in a range of about 3 μm to about 12 μm. The step compensation layer SCL may include about 2 wt % to about 7 wt % of the titanium dioxide based on the total weight of the step compensation layer SCL. However, the thickness and the content of the titanium dioxide of the step compensation layer SCL may be appropriately adjusted in a range in which visual recognition of a portion of the display device DD as dark (the display device DD having a low light transmittance) is reduced or prevented. However, the present disclosure is not limited thereto.

TABLE 1

| Position | Light transmittance ① of component except for step compensation layer | Light transmittance ② of step compensation layer Thickness (μm) of step compensation layer | | | | Final light transmittance (① × ②) Thickness (μm) of step compensation layer | | | |
|---|---|---|---|---|---|---|---|---|---|
| | | 6 | 10 | 12 | 15 | 6 | 10 | 12 | 15 |
| A-P1 | 100% | — | 68% | 65% | 60% | — | 68% | 65% | 60% |
| A-P2 | 70% | 75% | — | — | — | 53% | — | — | — |
| A-DA | 50% | | — | | | | 50% | | |

TABLE 2

| Position | Light transmittance ① of component except for step compensation layer | Light transmittance ② of step compensation layer Thickness (μm) of step compensation layer | | | | Final light transmittance (① × ②) Thickness (μm) of step compensation layer | | | |
|---|---|---|---|---|---|---|---|---|---|
| | | 6 | 10 | 12 | 15 | 6 | 10 | 12 | 15 |
| A-P1 | 100% | — | 60% | 55% | 50% | — | 60% | 55% | 50% |
| A-P2 | 70% | 68% | — | — | — | 48% | — | — | — |
| A-DA | 50% | | — | | | | 50% | | |

Because the titanium dioxide is a type of scattering material, a light beam passing through the titanium dioxide is scattered. Accordingly, it may be seen that the light transmittance decreases as the content of the titanium dioxide included in the step compensation layer SCL increases.

Further, as the thickness of the step compensation layer SCL increases, a frequency with which the light beam passing through the display device DD (see FIG. 4A) also passes through the titanium dioxide increases. Thus, it may be seen that the light transmittance decreases as the thickness of the step compensation layer SCL increases.

If a deviation is present between light transmittance values of the first part P1 of the step compensation layer SCL, the second part P2 of the step compensation layer SCL, and the display area DA, a visibility problem may occur for a user using the display device DD. For example, a portion of the display device DD, which has a low light transmittance, may be visually recognized as being dark. According to one or more embodiments of the present disclosure, the

TABLE 3

| Position | Light transmittance ① of component except for step compensation layer | Light transmittance ② of step compensation layer Thickness (μm) of step compensation layer | | | Final light transmittance (① × ②) Thickness (μm) of step compensation layer | | |
|---|---|---|---|---|---|---|---|
| | | 3 | 7 | 9 | 3 | 7 | 9 |
| A-P1 | 100% | 65% | 52% | 49% | 62% | 52% | 49% |
| A-P2 | 80% | 65% | — | — | 52% | — | — |
| A-DA | 50% | | — | | | 50% | |

TABLE 4

| Position | Light transmittance ① of component except for step compensation layer | Light transmittance ② of step compensation layer Thickness (μm) of step compensation layer 6 | 12 | Final light transmittance (① × ②) Thickness (μm) of step compensation layer 6 | 12 |
|---|---|---|---|---|---|
| A-P1 | 100% | 68% | 55% | 68% | 55% |
| A-P2 | 80% | 68% | — | 54% | — |
| A-DA | 50% | — | | 50% | |

In Tables 1 to 4, a first area A-P1 means a position of the display device DD (see FIG. 4A) in which the $(1\text{-}1)^{th}$ part P1-1 (see FIG. 4A) is present. A second area A-P2 means a position of the display device DD (see FIG. 4A) in which the second part P2 (see FIG. 4A) is present.

A first transmitted light beam L-P1 means a light beam passing through the first area A-P1. A second transmitted light beam L-P2 means a light beam passing through the second area A-P2. A display area transmitted light beam L-DA means a light beam passing through the display area DA.

In Tables 1 to 4, a light transmittance ① of a component except for the step compensation layer is defined as a transmittance of a light beam passing through a corresponding area if the step compensation layer SCL is not present in the display device DD. In a state in which the light transmittance of the first area A-P1 is set as 100%, a relative value compared based on this ratio is described as the light transmittance 1 of the component excluding the step compensation layer.

In Tables 1 to 4, the light transmittance ② of the step compensation layer is defined as a transmittance of the light beam passing through the corresponding area of the step compensation layer SCL.

In Tables 1 to 4, a final light transmittance ①×② is defined as a light transmittance when the light beam passing through the corresponding area passes through the step compensation layer and all the components except for the step compensation layer. The final light transmittance ①×② may be derived as a value obtained by multiplying the light transmittance ① of the component except for the step compensation layer by the light transmittance ② of the step compensation layer.

Further, in Tables 1 to 4, the light transmittance may mean an average light transmittance at a corresponding position.

If a difference between the transmittances of the transmitted light beams L-P1, L-P2, and L-DA is more than about 10%, and if the display device DD is viewed from the outside, a portion having a low light transmittance may be visually recognized as being dark. If the difference between the light transmittance of the transmitted light beams L-P1, L-P2, and L-DA is not more than about 10%, the visibility is improved.

Table 1 illustrates the light transmittance in one or more embodiments in which the step compensation layer SCL includes about 2 wt % of the titanium dioxide based on the total weight of the step compensation layer SCL. If the step compensation layer SCL is not present, the light transmittance in the first area A-P1 corresponds to 100%. If the step compensation layer SCL is not present, the light transmittance in the second area A-P2 corresponds to about 70%. Because the sealing member SL that overlaps the second area A-P2 is present in the second area A-P2, the second area A-P2 has a relatively low light transmittance as compared to the first area A-P1. Thus, if the step compensation layer SCL is not present, the second area A-P2 may be visually recognized as being darker than the first area A-P1.

In one or more embodiments in which the thickness of the first part P1 of the step compensation layer SCL corresponds to about 15 μm and the thickness of the second part P2 of the step compensation layer SCL is about 6 μm, the light transmittance of the $(1\text{-}1)^{th}$ part P1-1 of the step compensation layer SCL is about 60%, and the light transmittance of the second part P2 of the step compensation layer SCL corresponds to about 75%. In this case, the final light transmittance of the first area A-P1 is about 60%, and the final light transmittance of the second area A-P2 is about 53%. Thus, a difference between the final light transmittances of the first area A-P1 and the second area A-P2 is about 7%, and thus, by applying the present disclosure, the visibility of the display device DD is improved.

Table 2 illustrates the light transmittance in one or more embodiments in which the step compensation layer SCL includes about 2 wt % of the titanium dioxide based on the total weight of the step compensation layer SCL. If the step compensation layer SCL is not present, the light transmittance in the first area A-P1 corresponds to 100%. If the step compensation layer SCL is not present, the light transmittance in the second area A-P2 corresponds to about 70%. Because the sealing member SL that overlaps the second area A-P2 is present in the second area A-P2, the second area A-P2 has a relatively low light transmittance as compared to the first area A-P1. Thus, if the step compensation layer SCL is not present, the second area A-P2 may be visually recognized as being darker than the first area A-P1.

In one or more embodiments in which the thickness of the first part P1 of the step compensation layer SCL corresponds to about 15 μm and the thickness of the second part P2 of the step compensation layer SCL is about 6 μm, the light transmittance of the $(1\text{-}1)^{th}$ part P1-1 of the step compensation layer SCL is about 50%, and the light transmittance of the second part P2 of the step compensation layer SCL corresponds to about 68%. In this case, the final light transmittance of the first area A-P1 is about 50%, and the final light transmittance of the second area A-P2 is about 48%. Thus, a difference between the final light transmittances of the first area A-P1 and the second area A-P2 is about 2%, and thus, by applying the present disclosure, the visibility of the display device DD is improved.

Table 3 illustrates the light transmittance in one or more embodiments in which the step compensation layer SCL includes about 7 wt % of the titanium dioxide based on the total weight of the step compensation layer SCL. If the step compensation layer SCL is not present, the light transmittance in the first area A-P1 corresponds to 100%. If the step compensation layer SCL is not present, the light transmittance in the second area A-P2 corresponds to about 80%. Unlike Tables 1 and 2, in Table 3, the light transmittance of the second area A-P2 is increased by about 10%. This is because the light transmittance of the sealing member SL is improved. Because the sealing member SL that overlaps the second area A-P2 is present in the second area A-P2, the second area A-P2 has a relatively low light transmittance as compared to the first area A-P1. Thus, if the step compensation layer SCL is not present, the second area A-P2 may be visually recognized as being darker than the first area A-P1.

In one or more embodiments in which the thickness of the first part P1 of the step compensation layer SCL corresponds to about 7 μm and the thickness of the second part P2 of the step compensation layer SCL is about 3 μm, the light transmittance of the $(1-1)^{th}$ part P1-1 of the step compensation layer SCL is about 52%, and the light transmittance of the second part P2 of the step compensation layer SCL corresponds to about 65%. In this case, the final light transmittance of the first area A-P1 is about 52%, and the final light transmittance of the second area A-P2 is about 52%. Thus, a difference between the final light transmittances of the first area A-P1 and the second area A-P2 is about 0%, and thus, by applying the present disclosure, the visibility of the display device DD is improved.

Table 4 illustrates the light transmittance in one or more embodiments in which the step compensation layer SCL includes about 7 wt % of the titanium dioxide based on the total weight of the step compensation layer SCL. If the step compensation layer SCL is not present, the light transmittance in the first area A-P1 corresponds to 100%. If the step compensation layer SCL is not present, the light transmittance in the second area A-P2 corresponds to about 80%. Unlike Tables 1 and 2, in Table 4, the light transmittance of the second area A-P2 is increased by about 10%. This is because the light transmittance of the sealing member SL is improved. Because the sealing member SL that overlaps the second area A-P2 is present in the second area A-P2, the second area A-P2 has a relatively low light transmittance as compared to the first area A-P1. Thus, if the step compensation layer SCL is not present, the second area A-P2 may be visually recognized as being darker than the first area A-P1.

In one or more embodiments in which the thickness of the first part P1 of the step compensation layer SCL corresponds to about 12 μm and the thickness of the second part P2 of the step compensation layer SCL is about 6 μm, the light transmittance of the $(1-1)^{th}$ part P1-1 of the step compensation layer SCL is about 55%, and the light transmittance of the second part P2 of the step compensation layer SCL corresponds to about 68%. In this case, the final light transmittance of the first area A-P1 is about 55%, and the final light transmittance of the second area A-P2 is about 54%. Thus, a difference between the final light transmittances of the first area A-P1 and the second area A-P2 is about 1%, and thus, by applying the present disclosure, the visibility of the display device DD is improved.

Figure 7A:
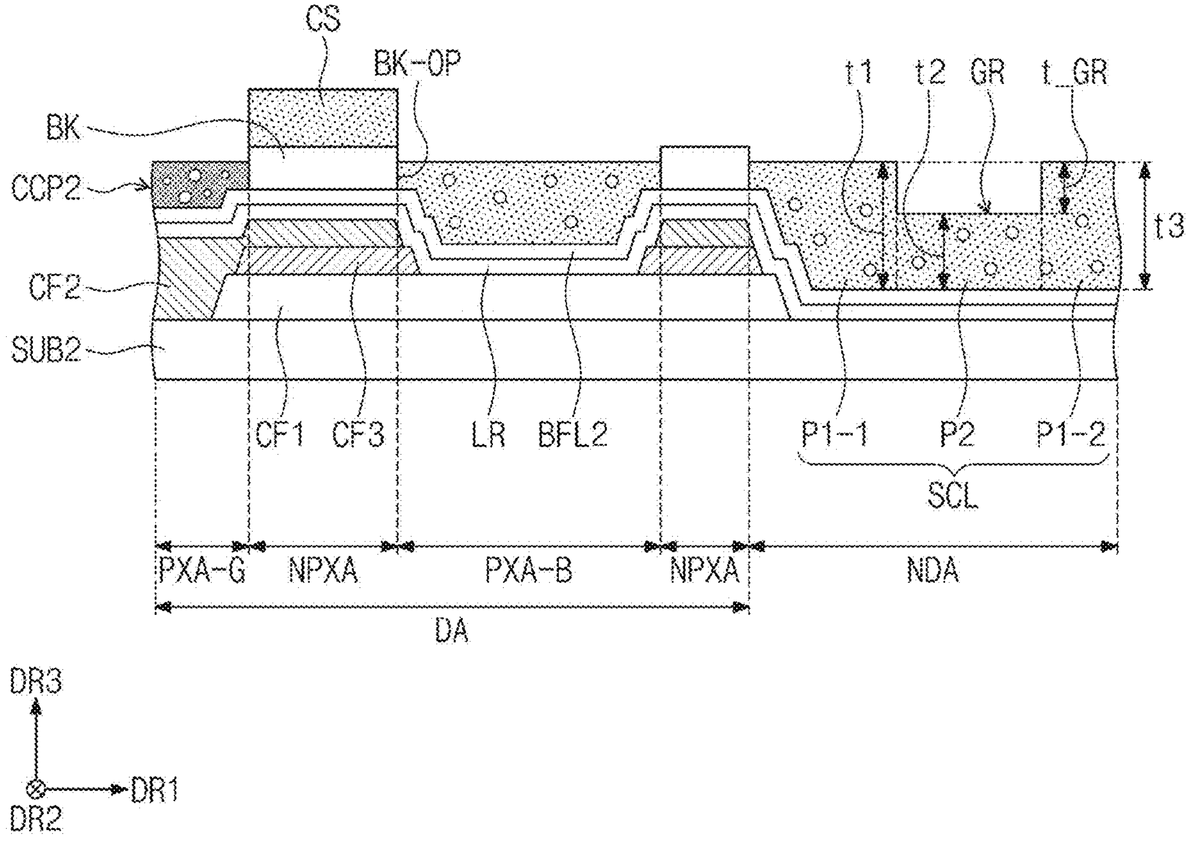
FIG. 7A is a cross-sectional view illustrating an operation of the method of manufacturing the display device according to one or more embodiments.
Figure 7B:
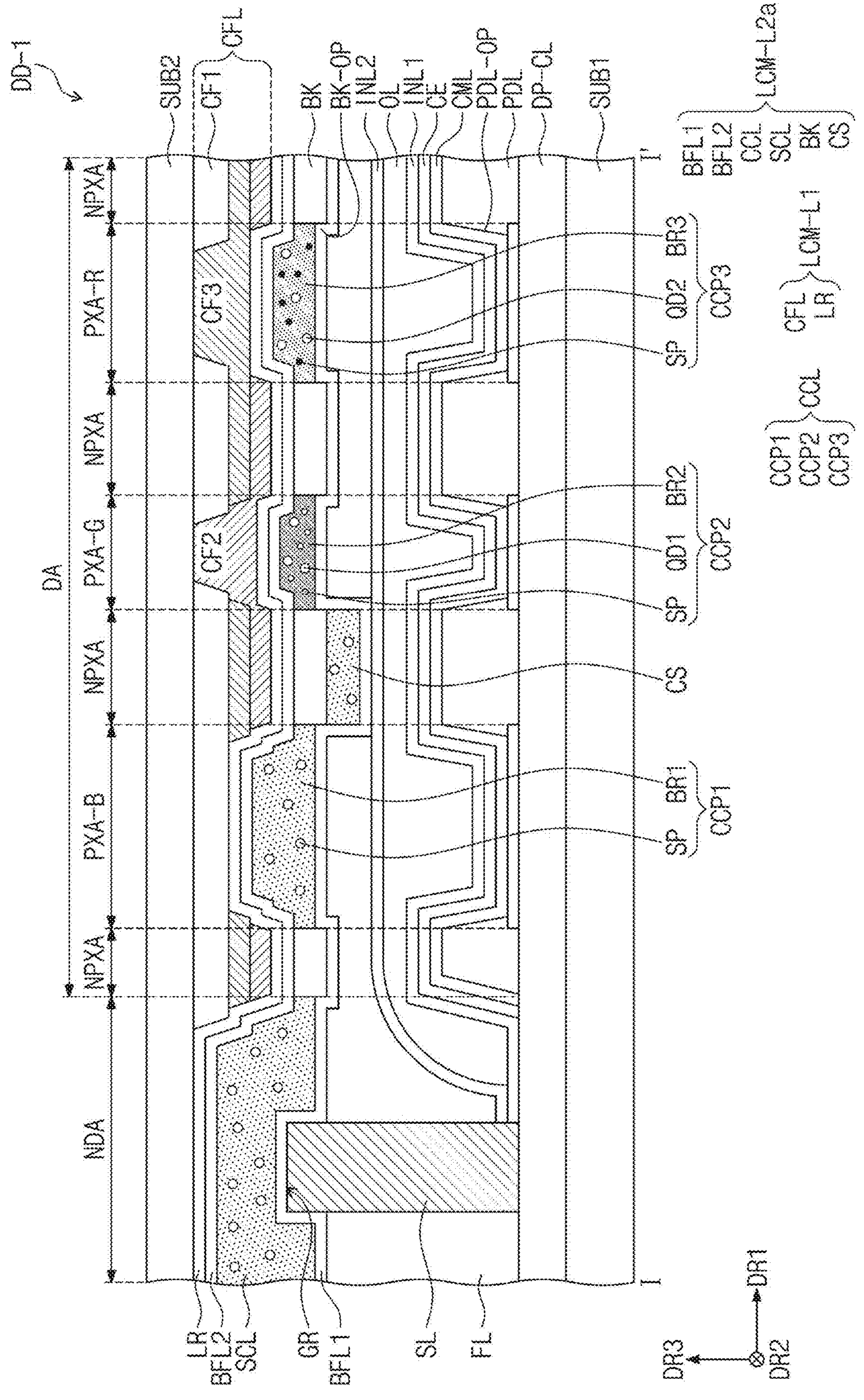
FIG. 7B is a cross-sectional view of the display device according to one or more embodiments.

FIG. 7A is a cross-sectional view illustrating an operation of the method of manufacturing the display device according to one or more embodiments. FIG. 7B is a cross-sectional view of the display device according to one or more embodiments. An embodiment of the present disclosure in which a column spacer CS is included and a method of manufacturing the same will be described with reference to FIGS. 7A and 7B.

A display device DD-1 according to one or more embodiments of the present disclosure may include the display panel DP, the light control member LCM, the sealing member SL located between the display panel DP and the light control member LCM, and the filling member FL. The display device DD-1 according to one or more embodiments may be manufactured by coupling the display panel DP and the light control member LCM through a bonding process.

The display panel DP (see FIG. 3) may include the base layer SUB1, the circuit layer DP-CL, the display element layer DP-OL (see FIG. 3), and the encapsulation layer TFE.

The light control member LCM may include the first light control member LCM-L1, a second light control member LCM-L2*a*, and the base substrate SUB2. The first light control member LCM-L1 may include the low refractive layer LR and the color filter layer CFL. The second light control member LCM-L2*a* may include the first barrier layer BFL1, the bank BK, the step compensation layer SCL, the column spacer CS, the light control layer CCL, and the second barrier layer BFL2. Components corresponding to the display device DD (see FIG. 4A) among the components of the display device DD-1 are described using the same/similar reference numerals, and duplicated descriptions thereof will be omitted.

The column spacer CS may be located on the bank BK between the light control member LCM and the display panel DP. That is, the column spacer CS may be located between the display element layer DP-OL (see FIG. 3) and the bank BK. The column spacer CS may overlap the non-light-emitting area NPXA. The column spacer CS allows a certain separation space to be formed between the light control member LCM and the display panel DP.

The column spacer CS may not be located on the entire bank BK, and may be located at a constant density within a range in which the column spacer CS and the light control member LCM are spaced apart from each other. For example, the column spacer CS may be located to overlap one non-light-emitting area NPXA among 10 non-light-emitting areas NPXA (e.g., on average). In this case, the bank BK includes all portions at which the column spacer CS is located, and portions at which the column spacer CS is not located.

To manufacture the display device DD-1 including the column spacer CS, operations corresponding to FIGS. 5A to 5F may be performed. However, an operation of etching a portion of the coating layer CT of the preliminary light control member P-LCM using a mask having a different shape from the mask MK (see FIG. 5C) may be performed. That is, an operation of forming the column spacer CS that overlaps the display area DA among the coating layer CT may be included. A process of forming the column spacer CS overlapping the display area DA and the non-light-emitting area NPXA may correspond to FIG. 7A.

The column spacer CS, the first light controller CCP1, and the step compensation layer SCL may be formed concurrently or substantially simultaneously by etching the coating layer CT. That is, the operation of forming the column spacer CS and the operation of forming the step compensation layer SCL may be formed concurrently or substantially simultaneously. Thus, the column spacer CS, the first light controller CCP1, and the step compensation layer SCL may be concurrently or substantially simultaneously formed using one type of mask. Thus, a process may be simplified, and economic efficiency may be promoted.

The column spacer CS, the first light controller CCP1, and the step compensation layer SCL may include the same material. For example, the column spacer CS, the first light controller CCP1, and the step compensation layer SCL may include the scatterer SP and the first base resin BR1 constituting the first light controller CCP1. Thus, the column spacer CS, the first light controller CCP1, and the step compensation layer SCL do not include the quantum dots QD1 and QD2, and thus economic efficiency may be secured as compared to a case in which the quantum dots QD1 and QD2 are included.

Figure 8:
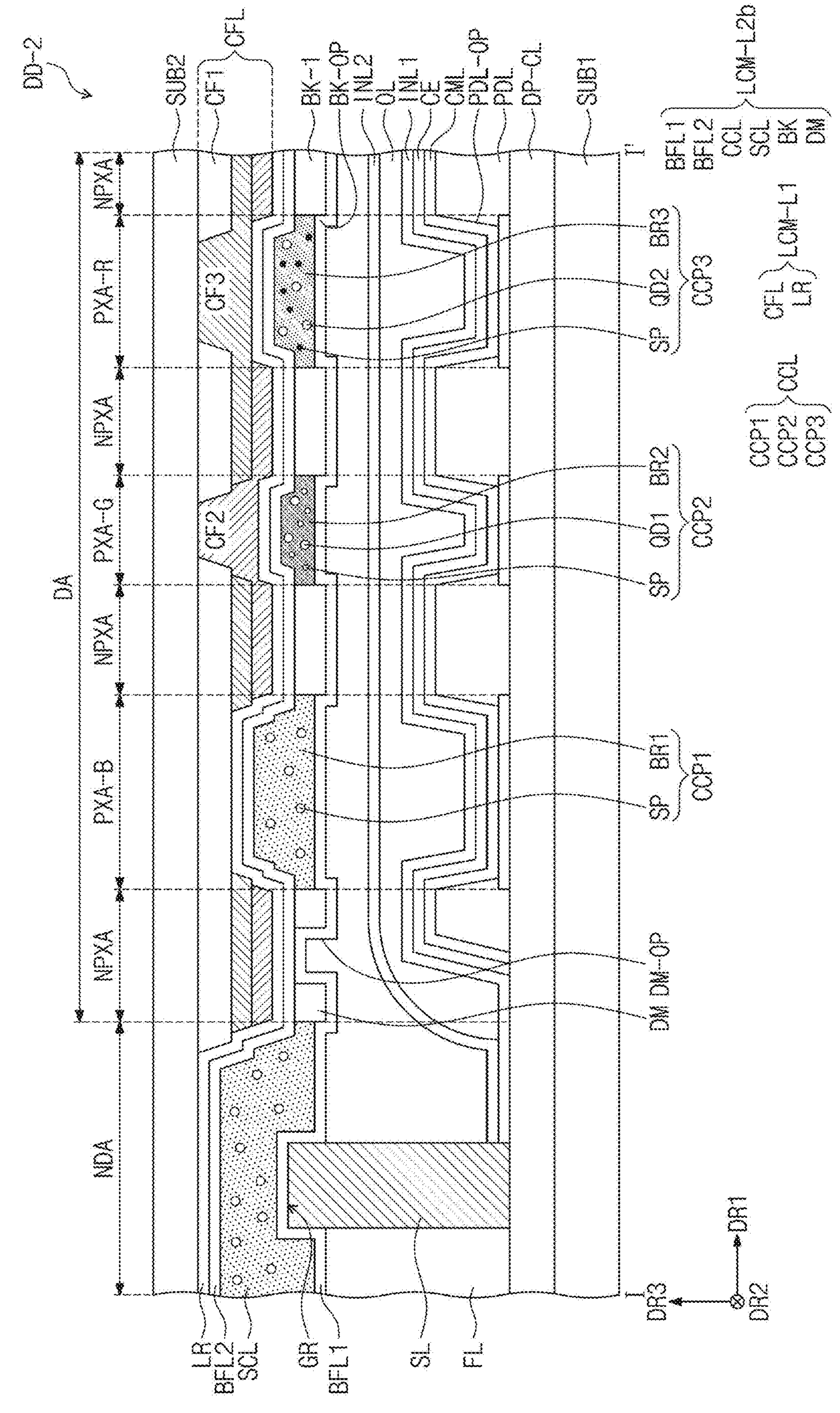
FIG. 8 is a cross-sectional view of the display device according to one or more embodiments.

FIG. 8 is a cross-sectional view of the display device according to one or more embodiments. FIG. 8 describes one or more embodiments of the present disclosure in which a dummy pattern DM is included.

A display device DD-2 according to one or more embodiments of the present disclosure may include the display panel DP, the light control member LCM, the sealing member SL located between the display panel DP and the light control member LCM, and the filling member FL. The display device DD-2 according to one or more embodiments may be manufactured by coupling the display panel DP and the light control member LCM through a bonding process.

The display panel DP may include the base layer SUB1, the circuit layer DP-CL, the display element layer DP-OL, and the encapsulation layer TFE.

The light control member LCM may include the first light control member LCM-L1, a second light control member LCM-L2*b*, and the base substrate SUB2. The first light control member LCM-L1 may include the low refractive layer LR and the color filter layer CFL. The second light control member LCM-L2*b* may include the first barrier layer BFL1, the bank BK, the step compensation layer SCL, the dummy pattern DM, the light control layer CCL, and the second barrier layer BFL2. Components corresponding to the display device DD (see FIG. 4A) among the components of the display device DD-2 are described using the same/similar reference numerals, and duplicated descriptions thereof will be omitted.

The dummy pattern DM may be located between the color filter layer CFL and the display element layer DP-OL. The dummy pattern DM functions to reduce or prevent degradation of the reliability of the display device DD-2 due to substances, such as moisture/oxygen intruding into the display device DD-2 from the outside, and then otherwise further intruding into the first to third light controllers CCP1, CCP2, and CCP3. FIG. 8 illustrates one dummy pattern DM, but the present disclosure is not limited thereto, and a plurality of dummy patterns DM may be provided.

The dummy pattern DM may include the same material as that of a bank BK-1. Thus, the dummy pattern DM may be a black matrix. The dummy pattern DM may include an organic light-blocking material or an inorganic light-blocking material including a black pigment or black dye.

The dummy pattern DM may include an opening DM-OP therein. The filling material FL may fill the dummy pattern opening DM-OP in a process of filling the light control member LCM and the display panel DP. However, the present disclosure is not limited thereto, and the opening DM-OP of the dummy pattern DM may include the same material as that of the first light controller CCP1.

According to one or more embodiments of the present disclosure, a step compensation layer including a groove is formed at a position at which a sealing member is located, and thus a problem that the sealing member is visually recognized from the outside may be solved. Further, in a process of manufacturing the display device, the step compensation layer may be easily formed.

Although the description has been made above with reference to one or more embodiments of the present disclosure, it may be understood that those skilled in the art or those having ordinary knowledge in the art may variously modify and make changes to the present disclosure without departing from the spirit and technical scope of the present disclosure described in the appended claims.

Accordingly, the technical scope of the present disclosure is not limited to the detailed description of the specification, but should be defined by the appended claims, with functional equivalents thereof to be included therein.

What is claimed is:

1. A display device comprising:

a base layer comprising a display area, and a non-display area adjacent to the display area;

a display element layer comprising a first light-emitting element, a second light-emitting element, and a third light-emitting element above the base layer and overlapping the display area;

a light control layer above the display element layer, and comprising a first light controller, a second light controller, and a third light controller respectively overlapping the first light-emitting element, the second light-emitting element, and the third light-emitting element;

a color filter layer above the light control layer and overlapping the display area;

a step compensation layer above the base layer, overlapping the non-display area, comprising a same material as that of the first light controller, and comprising a first part having a first thickness and a second part having a second thickness that is less than the first thickness; and a sealing member between the base layer and the step compensation layer, overlapping the non-display area, and overlapping the second part.

2. The display device of claim 1, wherein the second part contacts the sealing member.

3. The display device of claim 1, wherein a width of the second part in one direction is greater than or equal to a width of the sealing member in the one direction.

4. The display device of claim 1, wherein the first light controller and the step compensation layer comprise an organic material in which titanium dioxide is dispersed.

5. The display device of claim 1, further comprising a bank above the display element layer, and defining a first opening, a second opening, and a third opening, wherein the first light controller, the second light controller, and the third light controller respectively correspond to the first opening, the second opening, and the third opening.

6. The display device of claim 5, further comprising a column spacer between the display element layer and the bank.

7. The display device of claim 6, wherein the column spacer comprises a same material as the first light controller.

8. The display device of claim 1, wherein the step compensation layer and the sealing member have a light transmittance.

9. The display device of claim 1, wherein the first light-emitting element, the second light-emitting element, and the third light-emitting element respectively provide a source light beam, wherein the second light controller comprises a first quantum dot configured to convert at least a portion of the source light beam from the first light-emitting element into a light beam having a first color, and wherein the third light controller comprises a second quantum dot configured to convert at least a portion of the source light beam from the second light-emitting element into a light beam having a second color that is different from the first color.

10. The display device of claim 1, further comprising a base substrate above the step compensation layer and the color filter layer.

11. The display device of claim 10, further comprising a low refractive layer, partially between the color filter layer and the light control layer, and partially between the base substrate and the step compensation layer while contacting a lower surface of the base substrate.

12. The display device of claim 1, further comprising a barrier layer partially under the light control layer to cover an underside of the light control layer, and partially under the step compensation layer to cover an underside of the step compensation layer and to contact the sealing member.

13. The display device of claim 1, wherein the color filter layer is spaced from the non-display area in plan view.

14. The display device of claim 1, wherein the step compensation layer further comprises a third part spaced apart from the first part with the second part interposed therebetween, and having a third thickness that is greater than the second thickness, and wherein the first part, the second part, and the third part collectively define a groove.

15. A display device comprising:

a base layer comprising a display area, and a non-display area adjacent to the display area;

a display element layer above the base layer, and comprising a first light-emitting element, a second light-emitting element, and a third light-emitting element that overlap the display area;

a light control layer above the display element layer, and comprising a first light controller, a second light controller, and a third light controller that respectively overlap the first light-emitting element, the second light-emitting element, and the third light-emitting element;

a color filter layer overlapping the display area above the light control layer;

a step compensation layer overlapping the non-display area above the base layer; and a sealing member overlapping the non-display area between the base layer and the step compensation layer, wherein a second light transmittance of a second area overlapping the sealing member is less than a first light transmittance of a first area spaced apart from the sealing member in plan view.

16. The display device of claim 15, wherein a difference between the second light transmittance and the first light transmittance is about 10% or less.

17. The display device of claim 15, wherein a light transmittance in the display area is about 40% or more.

18. The display device of claim 15, wherein the step compensation layer comprises about 2 wt % to about 7 wt % of titanium dioxide based on a total weight of the step compensation layer, and wherein the step compensation layer has a thickness in a range of about 3 μm to about 12 μm.

19. The display device of claim 15, further comprising a dummy pattern between the color filter layer and the display element layer.

20. A method of manufacturing a display device, the method comprising:

providing a preliminary light control member comprising a base substrate comprising a display area, and a non-display area adjacent to the display area, and a color filter layer overlapping the display area above the base substrate;

forming a coating layer comprising an organic material, in which scatterers are dispersed, above the preliminary light control member; and etching a portion of the coating layer to form a step compensation layer comprising a first part having a first thickness and a second part having a second thickness that is less than the first thickness, and overlapping the non-display area.

21. The method of claim 20, further comprising arranging a mask comprising a semi-transmissive area in a portion corresponding to the non-display area above the preliminary light control member.

22. The method of claim 20, wherein, in the preliminary light control member further comprises a first light controller, a second light controller, and a third light controller overlapping the display area and arranged on the color filter layer.

23. The method of claim 20, further comprising forming a first light controller overlapping the display area by etching another portion of the coating layer concurrently or substantially simultaneously with the etching of the portion of the coating layer to form the step compensation layer.

24. The method of claim 20, wherein the preliminary light control member further comprises a bank above the color filter layer and defining a first opening, a second opening, and a third opening respectively corresponding to a first light controller, a second light controller, and a third light controller, and wherein the method further comprises forming a column spacer on the bank and overlapping the display area by etching another portion of the coating layer concurrently or substantially simultaneously with the etching of the portion of the coating layer to form the step compensation layer.

25. The method of claim 20, further comprising:

arranging the preliminary light control member, on which the step compensation layer is formed, on a display panel comprising a base layer and a display element layer above the base layer; and forming a sealing member overlapping the second part between the display panel and the step compensation layer.

* * * * *